United States Patent
Jeong et al.

(10) Patent No.: US 9,935,072 B2
(45) Date of Patent: Apr. 3, 2018

(54) SEMICONDUCTOR PACKAGE AND METHOD FOR MANUFACTURING THE SAME

(71) Applicant: SFA SEMICON CO., LTD., Cheonan-Si, Chungcheongnam-Do (KR)

(72) Inventors: Byeong Ho Jeong, Hwaseong-Si (KR); Eun Dong Kim, Seoul (KR); Jong Won Lee, Seoul (KR); Hyun Hak Jung, Cheonan-Si (KR); Jai Kyoung Choi, Busan (KR)

(73) Assignee: SFA SEMICON CO., LTD. (KR)

( * ) Notice: Subject to any disclaimer, the term of this patent is extended or adjusted under 35 U.S.C. 154(b) by 0 days.

(21) Appl. No.: 15/291,063

(22) Filed: Oct. 11, 2016

(65) Prior Publication Data
US 2017/0125369 A1    May 4, 2017

(30) Foreign Application Priority Data

Nov. 4, 2015  (KR) .................. 10-2015-0154600
Mar. 4, 2016  (KR) .................. 10-2016-0026490

(51) Int. Cl.
*H01L 23/52* (2006.01)
*H01L 23/00* (2006.01)
(Continued)

(52) U.S. Cl.
CPC .............. *H01L 24/16* (2013.01); *H01L 24/32* (2013.01); *H01L 24/73* (2013.01); *H01L 24/81* (2013.01);
(Continued)

(58) Field of Classification Search
None
See application file for complete search history.

(56) References Cited

U.S. PATENT DOCUMENTS 5,329,423 A * 7/1994 Scholz .................. H01L 23/32
                                                    174/263
6,635,969 B1 * 10/2003 Nakamura .......... H01L 25/0657
                                                    257/777
(Continued)

FOREIGN PATENT DOCUMENTS

KR   20110114912 A   10/2011
KR   20130124858 A   11/2013
(Continued)

*Primary Examiner* — Sitaramarao S Yechuri
(74) *Attorney, Agent, or Firm* — Renaissance IP Law Group LLP

(57) ABSTRACT

The present disclosure provides a semiconductor package that prevents a bump bridge from being formed between adjacent conductive bumps to realize a fine bump pitch when each unit circuit part is directly stacked without using a printed circuit board and a method for manufacturing the same. The semiconductor package includes a first semiconductor chip structure including a first unit circuit part, a first passivation layer disposed on the first unit circuit part, and a conductive bump electrically connected to the first unit circuit part, and a second semiconductor chip structure including a second unit circuit part, a second passivation layer having a stepped portion that is recessed inward and disposed on the second unit circuit part, and a bump pad provided in the stepped portion. The first semiconductor chip structure and the second semiconductor chip structure are stacked to allow the conductive bump to be bonded to the bump pad within the stepped portion.

13 Claims, 13 Drawing Sheets

(51) Int. Cl.
*H01L 25/065* (2006.01)
*H01L 25/00* (2006.01)

(52) U.S. Cl.
CPC .......... *H01L 24/83* (2013.01); *H01L 25/0657* (2013.01); *H01L 25/50* (2013.01); *H01L 2224/16147* (2013.01); *H01L 2224/32145* (2013.01); *H01L 2224/73253* (2013.01); *H01L 2224/81193* (2013.01); *H01L 2224/81203* (2013.01); *H01L 2224/83855* (2013.01); *H01L 2225/06513* (2013.01); *H01L 2225/06558* (2013.01); *H01L 2924/3841* (2013.01)

(56) References Cited

U.S. PATENT DOCUMENTS

| | | | |
|---|---|---|---|
| 7,863,721 B2 | 1/2011 | Suthiwongsunthom et al. | |
| 8,860,229 B1 | 10/2014 | Lin | |
| 2006/0292824 A1 | 12/2006 | Beyne et al. | |
| 2008/0023829 A1* | 1/2008 | Kok | H01L 24/16 257/737 |
| 2009/0072374 A1* | 3/2009 | Dobritz | H01L 25/0657 257/686 |
| 2009/0111217 A1* | 4/2009 | Chung | H01L 24/02 438/109 |
| 2010/0213589 A1* | 8/2010 | Hsieh | H01L 21/4832 257/676 |
| 2011/0272798 A1 | 11/2011 | Lee et al. | |
| 2012/0104599 A1 | 5/2012 | Tai et al. | |
| 2012/0295085 A1* | 11/2012 | Iida | B32B 27/34 428/212 |
| 2014/0191391 A1* | 7/2014 | Chuang | H01L 24/81 257/737 |
| 2015/0072477 A1* | 3/2015 | Matsumura | C09J 7/0242 438/118 |

FOREIGN PATENT DOCUMENTS

| | | |
|---|---|---|
| KR | 20130129068 A | 11/2013 |
| KR | 20150113362 A | 10/2015 |
| KR | 20160085197 A | 7/2016 |

* cited by examiner

160 : 162, 164

160 : 162, 164

SEMICONDUCTOR PACKAGE AND METHOD FOR MANUFACTURING THE SAME

CROSS-REFERENCE TO RELATED APPLICATION

This application claims priority to Korean Patent Application Nos. 10-2015-0154600 filed on Nov. 4, 2015 and 10-2016-0026490 filed on Mar. 4, 2016 and all the benefits accruing therefrom under 35 U.S.C. § 119, the contents of which are incorporated by reference in their entirety.

BACKGROUND

The present disclosure relates to a semiconductor package and a method for manufacturing the same, and more particularly, to a semiconductor package that prevents a bump bridge from being formed between adjacent conductive bumps to realize a fine bump pitch and a method for manufacturing the same.

Stacked semiconductor packages are packages that are manufactured by using a three-dimensional (3D) chip stacking technique included in a highly integrated packaging technology.

Examples of a method of stacking semiconductor chips based on the 3D chip stacking technique include a chip to chip (C2C) method, a chip to wafer (C2W) method, a wafer to wafer (W2W) method, etc. Here, the C2C stacking technique is relevant to a method of stacking a semiconductor chip and a semiconductor chip, and the C2W stacking technique is relevant to a method of stacking a semiconductor chip and a semiconductor wafer.

Also, the W2W stacking technique is relevant to a method of stacking a semiconductor wafer and a semiconductor wafer. Considering productivity, the C2W stacking technique or the W2W stacking technique where wafers and chips are stacked by a wafer unit is better than the C2C stacking technique where chips are stacked by a chip unit.

With the high-performance and miniaturization trend of electronic devices, the number of input/output (I/O) terminals of a semiconductor package has considerably increased, and thus, a bump pitch that electrically connects a top semiconductor package and a bottom semiconductor package of a stacked semiconductor package is on a fining trend.

As described above, as a bump pitch becomes narrower, a defect where a bump bridge is formed between adjacent bumps can occur, and for this reason, there is a limitation in implementing a stacked semiconductor package including a fine bump pitch.

PRIOR ART DOCUMENTS

Patent Documents (Patent Document 1) KR10-2015-0113362 A

SUMMARY

The present disclosure provides a semiconductor package that prevents a bump bridge from being formed between adjacent conductive bumps to realize a fine bump pitch when each unit circuit part is directly stacked without using a printed circuit board and a method for manufacturing the same.

In accordance with an exemplary embodiment, a semiconductor package includes: a first semiconductor chip structure including a first unit circuit part, a first passivation layer disposed on the first unit circuit part, and a conductive bump electrically connected to the first unit circuit part; and a second semiconductor chip structure including a second unit circuit part, a second passivation layer having a stepped portion that is recessed inward and disposed on the second unit circuit part, and a bump pad provided in the stepped portion, wherein the first semiconductor chip structure and the second semiconductor chip structure are stacked to allow the conductive bump to be bonded to the bump pad within the stepped portion.

The semiconductor package may further include a glue layer provided between the first passivation layer and the second passivation layer.

The conductive bump may include a conductive pillar and a conductive solder disposed on the conductive pillar.

The conductive pillar may have a height greater than a thickness of the glue layer.

The glue layer may be spaced near the conductive bump.

The stepped portion may have a cross-section greater than that of the conductive bump.

The bump pad may extend to cover a bottom surface and a sidewall of at least a portion of the stepped portion.

The bump pad and the conductive bump may include the same component.

The first semiconductor chip structure may further include a first redistribution layer configured to electrically connect an input/output pad of the first unit circuit part to the conductive bump, and the second semiconductor chip structure may further include a second redistribution layer configured to electrically connect an input/output pad of the second unit circuit part to the bump pad.

At least one of the first and second semiconductor chip structures may have a semiconductor wafer shape.

In accordance with another exemplary embodiment, a method for manufacturing a semiconductor package includes: manufacturing a first semiconductor chip structure, which includes forming a first passivation layer on a first unit circuit part and forming a conductive bump electrically connected to the first unit circuit part; manufacturing a second semiconductor chip structure, which includes forming a second passivation layer on a second unit circuit part, forming a stepped portion that is recessed into the passivation layer, and forming a bump pad within the stepped portion; stacking the first semiconductor chip structure and a second semiconductor chip structure so that the first passivation layer faces the second passivation layer; and bonding the conductive bump to the bump pad within the stepped portion.

The method may further include forming a glue layer on at least one layer of the first and second passivation layers.

The conductive bump may include a conductive pillar and a conductive solder formed on the conductive pillar, and the bonding of the conductive bump to the bump pad may include thermally compressing the conductive solder to fill the conductive solder into the stepped portion.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
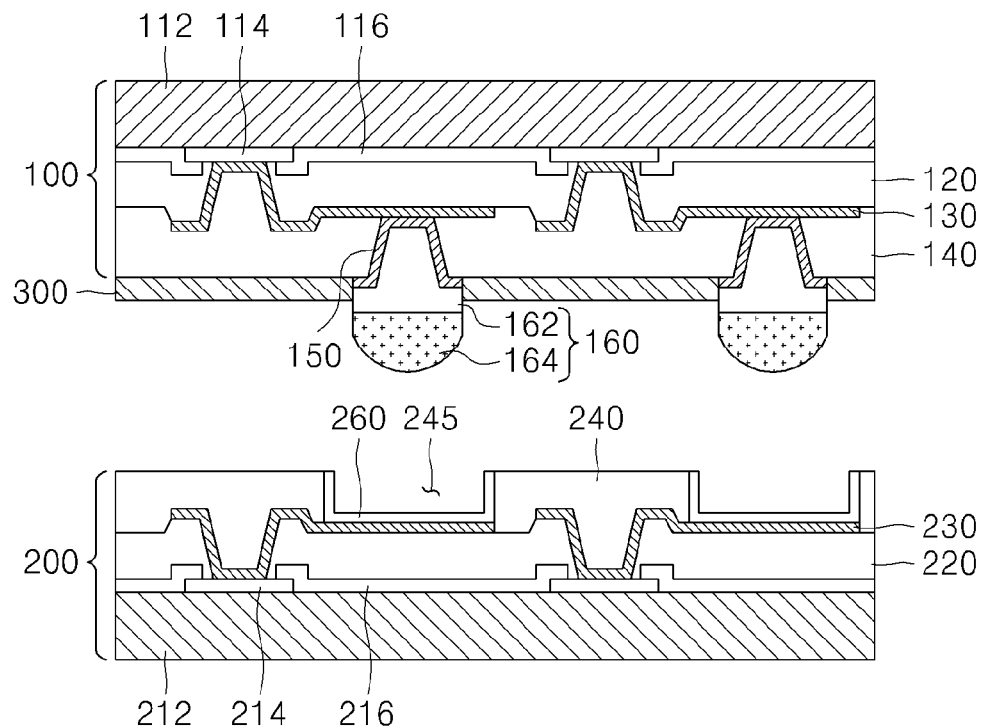
FIG. 1 is a schematic cross-sectional view of a first semiconductor chip structure and a second semiconductor chip structure in accordance with an exemplary embodiment.

Hereinafter, specific embodiments will be described in detail with reference to the accompanying drawings. The present invention may, however, be embodied in different forms and should not be construed as limited to the embodiments set forth herein. Rather, these embodiments are provided so that the present invention will be thorough and complete, and will fully convey the scope of the present invention to those skilled in the art.

It will also be understood that when a layer, a film, a region or a plate is referred to as being 'on' another one, it can be directly on the other one, or one or more intervening layers, films, regions or plates may also be present.

Also, spatially relative terms, such as "above" or "upper" and "below" or "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Here, like reference numerals refer to like elements throughout.

Figure 2:
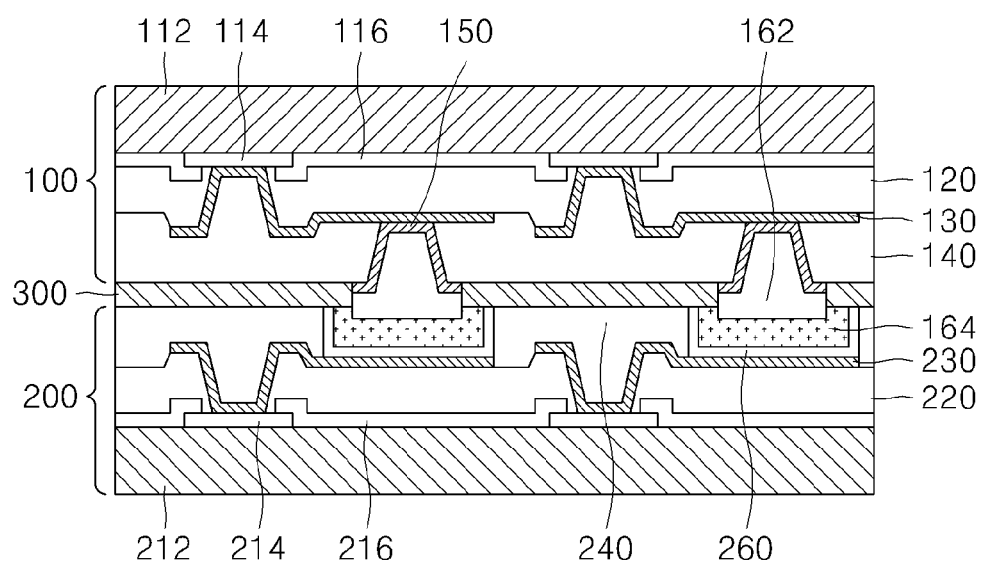
FIG. 2 is a schematic cross-sectional view of a semiconductor package in accordance with an exemplary embodiment.

FIG. 1 is a schematic cross-sectional view of a first semiconductor chip structure and a second semiconductor chip structure in accordance with an exemplary embodiment, and FIG. 2 is a schematic cross-sectional view of a semiconductor package in accordance with an exemplary embodiment.

Referring to FIGS. 1 and 2, a semiconductor package in accordance with an exemplary embodiment includes a first unit circuit part (not shown), a first passivation layer 140 disposed on the first unit circuit part, a first semiconductor chip structure 100 including a conductive bump 160 electrically connected to the first unit circuit part, and a second semiconductor chip structure 200 including a second unit circuit part (not shown), a second passivation layer 240 having a stepped portion 245 that is recessed therein and disposed on the second unit circuit part, and a bump pad 260 disposed in the stepped portion 245. The first semiconductor chip structure 100 and the second semiconductor chip structure 200 are stacked by bonding the conductive bump 160 to the bump pad 260 within the stepped portion 245.

The semiconductor structure that is described below may represent a semiconductor wafer shape in which a plurality of unit circuit parts are arranged on one substrate to form a conductive pattern such as a conductive bump or a bump pad or a semiconductor chip shape in which a plurality of unit circuit parts are respectively disposed on substrates that are physically separated from each other to form a conductive pattern.

First, the first semiconductor chip structure 100 may further include a first intermediate passivation layer 120 formed to have an exposed region including an input/output pad 114 of the first unit circuit part so as to redistribute a path for electrically connecting the input/output pad 114 regardless of a position of the input/output pad 114 of the first unit circuit part and a first redistribution layer 130 formed to electrically connect the input/output pad 114 of the first unit circuit part to the conductive bump 160.

The unit circuit part may represent a semiconductor stacking body for performing functions such as information conversion, storage, and operation and a line structure thereof. The first unit circuit part may be disposed on a substrate 112 or a wafer and further include the input/output pad 114 electrically connected to an external circuit and a protective layer 116 exposing the input/output pad 114 and protecting the unit circuit part.

The first intermediate passivation layer 120 is disposed on the first unit circuit part to expose the input/output pad 114 of the first unit circuit part. The first intermediate passivation layer 120 may perform functions that protects the input/output pad 114 of the first unit circuit part and maintains insulation between the input/output pads 114 and serve as a planarization support body for forming a first redistribution layer 130 that will be described later. For this, the first intermediate passivation layer 120 may be formed of at least one of polyimide (PI), benzo cyclo butene (BCB), poly benz oxazole (PBO), bismaleimidetriazine (BT), phenolic resin, epoxy, silicone, an oxide layer ($SiO_x$), and a nitride layer ($SiN_x$).

The first redistribution layer 130 is disposed on the input/output pad 114 and the first intermediate passivation layer 120 to electrically connect the input/output pad 114 of the first unit circuit part that is exposed by the first intermediate passivation layer 120 to the conductive bump 160. The first redistribution layer 130 may include a first redistribution seed layer (not shown). Here, the first redistribution seed layer functions as a seed for forming the first redistribution layer 130. That is, when the first redistribution layer 130 is formed by using an electroplating process, the first redistribution seed layer may provide a path through which current flows to grow the first redistribution layer 130 from the first redistribution seed layer. However, the first redistribution layer 130 may be directly formed on the first intermediate passivation layer 120 by using the electroless plating process. In this case, the first redistribution seed layer may be omitted.

The first redistribution layer 130 may redistribute an electrical path of the first unit circuit part. That is, the first redistribution layer 130 redistributes a path for electrically connecting the input/output pad 114 to the conductive bump 160 to stack the semiconductor chip structures with respect to each other regardless of the position of the input/output pad 114 of the first unit circuit part. Here, the first redistribution layer 130 may be formed of a material having high conductivity such as copper.

The first passivation layer 140 is disposed around the conductive bump 160. That is, the first passivation layer 140 is disposed to expose an end of the first redistribution layer 130, the conductive bump 160 is electrically connected to the end of the first redistribution layer 130, and the first passivation layer 140 is disposed around the conductive bump 160.

The first passivation layer 140 may protect the first redistribution layer 130 and maintain the insulation between the first redistribution layers 130 and also planarize a surface of the first semiconductor chip structure 100. For this, the first passivation layer 140 may be formed of at least one of polyimide (PI), benzo cyclo butene (BCB), poly benz oxazole (PBO), bismaleimidetriazine (BT), phenolic resin, epoxy, silicone, an oxide layer ($SiO_x$), and a nitride layer ($SiN_x$).

Also, the first passivation layer 140 is formed of a material different from that of the first intermediate passivation layer 120. When the first passivation layer 140 and the first intermediate passivation layer 120 are formed of materials different from each other, penetrated moisture, etc., may move along a boundary between the layers formed of the materials different from each other to increase in moving distance. Thus, the moisture, etc., may be prevented from being penetrated.

The conductive bump 160 is electrically connected to the first redistribution layer 130 and disposed on the end of the first redistribution layer 130. The conductive bump 160 may be disposed on an under bump metal (UBM) layer 150 disposed on the end of the first redistribution layer 130 to reinforce an adhesive force of the first redistribution layer 130. The UBM 150 may include an under bump metal (UBM) seed layer (not shown).

The UBM seed layer is disposed on the end of the first redistribution layer 130 exposed by the first passivation layer 140. That is, when the UBM layer 150 is formed by using an electroplating process, the UBM seed layer may provide a path through which current flows from the first redistribution layer 130 and be electrically connected to the conductive bump 160. Here, the UBM seed layer may be formed of a material having high conductivity such as copper.

The UBM layer 150 may be formed by stacking a plurality of layers. That is, the UBM layer 150 may be formed by stacking a plurality of layers constituted by a chrome material, a chrome-copper alloy, and a copper material, a plurality of layers constituted by a titanium-tungsten alloy and a copper material, or a plurality of layers constituted by a nickel material and a copper material. Thus, this is done for improving conductivity and reinforcing an adhesive force between the first redistribution layer 130 and the conductive bump 160.

The conductive bump 160 is disposed on the UBM layer 150 and bonded to the bump pad 260 of the second semiconductor chip structure 200 that will be described later. That is, since the first semiconductor chip structure 100 and the second semiconductor chip structure 200 are stacked to bond the conductive bump 160 of the first semiconductor chip structure 100 to the bump pad 260 of the second semiconductor chip structure 200, the first semiconductor chip structure 100 and the second semiconductor chip structure 200 may be electrically connected to each other to form a stacked semiconductor package.

Although the conductive bump 160 is a conductive solder that is directly disposed on the UBM layer 150, the conductive bump 160 may have a pillar bump structure including a conductive pillar 162 disposed on the UBM layer 150 and a conductive solder 164 disposed on the conductive pillar. When the conductive bump 160 has the pillar bump structure, since the conductive pillar 162 may be manufactured in a pillar shape that is thinner than the conductive solder directly disposed on UBM layer 150, a conductive pattern of the first redistribution layer 130 to which the conductive pillar 162 is attached may be formed with a fine pitch. Thus, the conductive bump 160 may also be formed with a fine bump pitch.

The conductive pillar 162 is disposed on the UBM layer 150 by using the electroplating process, and the conductive solder 164 disposed on the conductive pillar 162 is bonded to the bump pad 260 of the second semiconductor chip structure 200. Here, the conductive pillar 162 may be formed of a copper material. The conductive solder 164 may be formed of at least one material selected from Sn, SnAg, Sn—Pb, SnAgCu, SnAgZn, SnZn, SnBi—In, Sn—In, Sn—Au, SnPb, SnCu, SnZnIn, and SnAgSb.

Although not shown, when the conductive bump 160 has the pillar bump structure, a diffusion barrier layer may be further provided between the conductive pillar 162 and the conductive solder 164. The diffusion barrier layer may prevent a metal component of the conductive pillar 162 from being diffused to the conductive solder 164 and be formed of Ni, Ni(P), Ni(V), or the like.

Next, the second semiconductor chip structure 200 may further include a second intermediate passivation layer 220 formed to have an exposed region including an input/output pad 214 of the second unit circuit part so as to redistribute a path for electrically connecting the bump pad 260 regardless of a position of the input/output pad 214 of the second unit circuit part and a second redistribution layer 230 formed to electrically connect the input/output pad 214 of the second unit circuit part to the bump pad 260.

Here, since the second unit circuit part, the second intermediate passivation layer 220, and the second redistribution layer 230 of the second semiconductor chip structure 200 are the same as the first unit circuit part, the first intermediate passivation layer 120, and the first redistribution layer 130 of the first semiconductor chip structure 100 except for an arranged direction thereof, their duplicated descriptions will be omitted.

The second passivation layer 240 has a stepped portion 245 that is recessed inward to accommodate the conductive bump 160 of the first semiconductor chip structure 100. The bump pad 260 is disposed in the stepped portion 245. Here, the stepped portion 245 may have various shapes that are recessed to accommodate the conductive bump 160 therein. As illustrated in the drawings, the stepped portion 245 may be recessed to pass through the inside of the second intermediate passivation layer 220, thereby accommodating the conductive bump 160 therein. That is, the second passivation layer 240 is disposed to expose an end of the second redistribution layer 230, and the bump pad 260 is electrically connected to the end of the second redistribution layer 230 to form the stepped portion of the second passivation layer 240 and the bump pad 260 provided in the stepped portion 245.

The second passivation layer 240 may isolate the bump pad 260 disposed on the end of the second redistribution layer 230 and the conductive bump 160 of the first semiconductor chip structure 100 bonded to the bump pad 260 from the other adjacent bump pad and conductive bump by the stepped portion 245 that accommodates the conductive bump 160 of the first semiconductor chip structure 100. That is, the second passivation layer 240 may the stepped portion having a height greater than that of the bump pad 260 with the bump pad 260 therebetween to isolate the bump pad 260 and the conductive bump 160 from the other adjacent bump pad and conductive bump by the adhesion between the second passivation layer 240 and the first passivation layer 140.

Here, the stepped portion 245 of the second passivation layer 240 may have a cylindrical shape having a cross-section greater than that of the conductive bump 160 of the first semiconductor chip structure 100. Since the stepped portion 245 of the second passivation layer 240 has a diameter greater than that of the conductive bump 160, when the first semiconductor chip structure 100 and the second semiconductor chip structure 200 are stacked and bonded to each other, the conductive bump 160 of the first semiconductor chip structure 100 may flow into the stepped portion 245 that is blocked by the adhesion between the first passivation layer 140 and the second passivation layer 240 while having flowability and thus be completely filled.

The second passivation layer 240 may protect the second redistribution layer 230 and maintain the insulation between the second redistribution layers 230 and also planarize a surface of the second semiconductor chip structure 200. For this, the second passivation layer 240 may be formed of at least one of polyimide (PI), benzo cyclo butene (BCB), poly benz oxazole (PBO), bismaleimidetriazine (BT), phenolic resin, epoxy, silicone, an oxide layer ($SiO_x$), and a nitride layer ($SiN_x$). Also, the second passivation layer 240 may be formed of a material different from that of the second intermediate passivation layer 220 to prevent moisture, etc., from being penetrated, like the first passivation layer 140.

The bump pad 260 is disposed on an end of the second redistribution layer and electrically connected to the second redistribution layer 230 within the stepped portion 245. Here, the arranged configuration of the bump pad 260 may correspond to that of the above-described conductive bump 160. That is, the conductive bump 160 of the first semiconductor chip structure 100 and the bump pad 260 of the second semiconductor chip structure 200 may be electrically connected to each other to stack and bond the first semiconductor chip structure 100 to the second semiconductor chip structure 200, thereby forming a structure of the stacked semiconductor package. As described above, since the bump pad 260 buried into the stepped portion 245 of the second passivation layer 240, not the connection between the conductive bumps, is used for the electrical connection with the conductive bump 160 of the first semiconductor chip structure 100, the semiconductor package may be minimized in thickness, and also, the adjacent bump pads and the adjacent conductive bumps may be completely isolated from each other. Also, a defect such as a bump bridge or short circuit between the conductive bumps 160 may be fundamentally prevented to more effectively realize the fine bump pitch.

The bump pad 260 may be formed from a bump pad seed layer (not shown) disposed on the second passivation layer 240 and the second redistribution layer 230 by using the electroplating process. In this case, the bump pad seed layer provides a path through which current flows from the second redistribution layer 230 and is electrically connected to the bump pad 260. The bump pad 260 may be formed of a material having high conductivity such as copper. Here, the bump pad 260 may be formed by stacking a Pb-free solder layer such as a nickel layer and SnAg on a copper layer. The bump pad 260 may include the same component as the conductive bump 160. Here, when the conductive bump 160 has the pillar bump structure as described above, the bump pad 260 may commonly include the same component as the conductive solder 164, e.g., the copper component. As described above, when the bump pad 260 and the conductive solder 164 include the same component, wetting on an interface therebetween may be improved, and the adhesion between the bump pad 260 and the conductive solder 164 may be improved.

Also, the bump pad 260 may extend to cover a bottom surface and a sidewall of at least a portion of the stepped portion 245 to improve the adhesion with the conductive solder 164 and effectively fill the inside of the stepped portion 245 while preventing the conductive bump 160 filled into the stepped portion 245 from overflowing out of the stepped portion 245. This is done for allowing the conductive bump 160 formed of a metal component to maintain low interface energy due to homozygous junction with the bump pad 260 formed of a metal component within the stepped portion 245 by allowing the bump pad 260 to extend to the sidewall of the stepped portion 245. Thus, the conductive bump may be prevented from being discharged to an interface between the first and second passivation layers 140 and 240, which are formed of an inorganic material such as an insulative resin that is a heterogeneous material or between each of the passivation layers 140 and 240 and the glue layer 300, and thus, the inside of the stepped portion 245 may be effectively filled.

The semiconductor package in accordance with an exemplary embodiment may further include the glue layer 300 disposed between the first passivation layer 140 and the second passivation layer 240. The glue layer 300 may be disposed on the first passivation layer 140 or the second passivation layer 240 or disposed on all the first and second passivation layers 140 and 240. The glue layer 300 may be a layer which is formed by thermally curing liquid glue having certain viscosity and is applied on the passivation layer. Here, the liquid glue may be a nonconductive material in electricity, and for example, may be a thermosetting resin, such as epoxy, or a thermoplastic resin such as polyether amid or polyimide siloxane.

Also, the glue layer 300 may have a thickness less than that of the conductive bump 160. As described above, when the conductive bump 160 has the pillar bump structure, the glue layer 300 may have a thickness less than a height of the conductive pillar 164. That is, since the conductive bump 160 or the conductive pillar 164 has a height greater than that of the glue layer 300, the conductive bump 160 may be inserted into the stepped portion 245 of the second passivation layer 240 via the glue layer 300 to minimize the thickness of the semiconductor package when the first semiconductor chip structure 100 and the second semiconductor chip structure 200 are stacked.

As the first semiconductor chip structure 100 and the second semiconductor chip structure 200 are stacked, the first passivation layer 140 and the second passivation layer 240 are adhered to each other by using the glue layer 300 as a medium, and the conductive bump 160 is bonded to the bump pad 260 within the stepped portion 245 to fill the inside of the stepped portion 245, thereby manufacturing the stacked semiconductor package.

Here, the stepped portion 245 may have a volume that is equal to or greater than that of the conductive bump 160 that is accommodated in the stepped portion 245. Here, when the stepped portion 245 has the same volume as the conductive bump 160 accommodated in the stepped portion 245, the stepped portion 245 may be completely filled with the conductive bump 160 by the stacking and bonding of the first and second semiconductor chip structures 100 and 200. However, when the stepped portion 245 has a volume greater than that of the conductive bump 160, an air gap may be formed in the stepped portion 245. Moisture may be penetrated into the air gap, and the penetrated moisture may be gasified by high-temperature heat generated in the process processing to cause popcorn cracks, thereby manufacturing a defective package. In case of the semiconductor package in accordance with an exemplary embodiment, although the stepped portion 245 has the volume greater than that of the conductive bump 160, the glue layer 300 that is thermally compressed may be filled into the air gap within the stepped portion 245, and thus, the stepped portion 245 may be completely filled with the conductive bump 160 and the glue layer 300.

Also, as described above, when the stepped portion 245 has the cross-section greater than that of the conductive bump 160, the glue layer 300 may be disposed on a top surface of the second passivation layer 240 to allow the glue layer 300 to be spaced near the conductive bump when the first and second passivation layers 140 and 240 are adhered to each other. As described above, when the glue layer 300 is spaced near the conductive bump 160, the conductive bump 160 may flow into the spaced space between the glue layer 300 and the conductive bump 160 as well as the stepped portion 245 formed in the second passivation layer 240 to prevent the conductive bump 160 from leaking out of the stepped portion 245.

Figure 3:
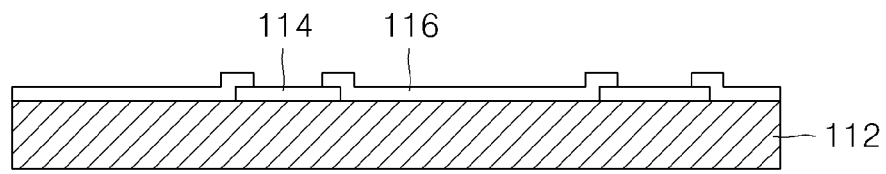
FIGS. 3 to 5 are cross-sectional views illustrating a method for manufacturing a first semiconductor chip structure in accordance with an exemplary embodiment.
Figure 4:
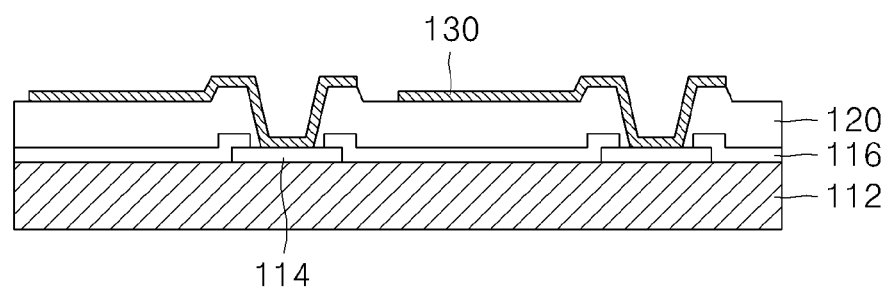
Figure 5:
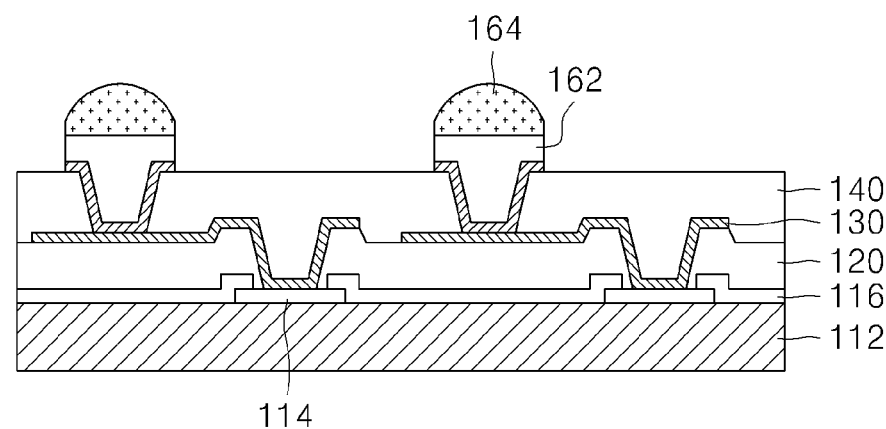
Figure 11:
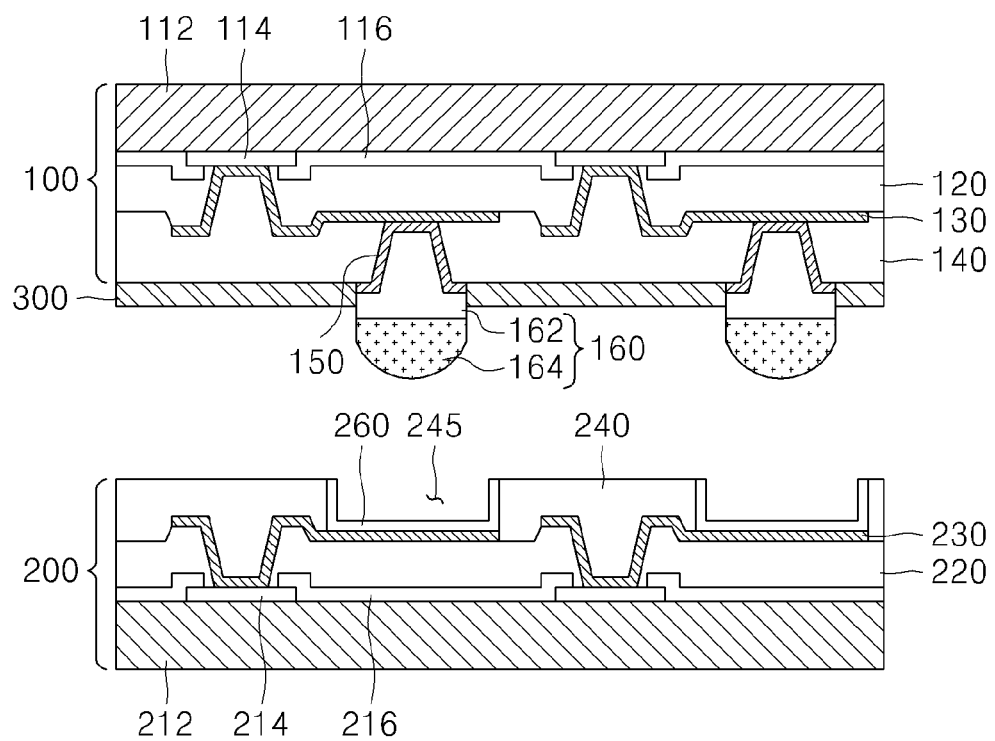
FIG. 11 is a cross-sectional view illustrating a state in which the first semiconductor chip structure and the second semiconductor chip structure are stacked in accordance with an exemplary embodiment.
Figure 12:
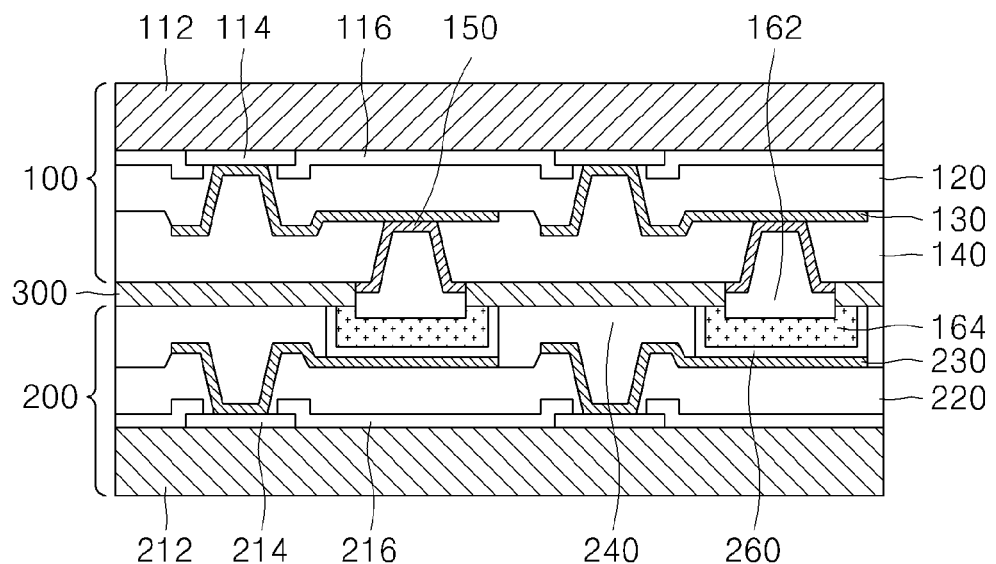
FIG. 12 is a cross-sectional view illustrating a state in which the first semiconductor chip structure and the second semiconductor chip structure are bonded to each other in accordance with an exemplary embodiment.

FIGS. 3 to 5 are cross-sectional views illustrating a method for manufacturing the first semiconductor chip structure in accordance with an exemplary embodiment, and FIGS. 6 to 10 are cross-sectional views illustrating a method for manufacturing the second semiconductor chip structure in accordance with an exemplary embodiment. Also, FIG. 11 is a cross-sectional view illustrating a state in which the first semiconductor chip structure and the second semiconductor chip structure are stacked in accordance with an exemplary embodiment, and FIG. 12 is a cross-sectional view illustrating a state in which the first semiconductor chip structure and the second semiconductor chip structure are bonded to each other in accordance with an exemplary embodiment.

Referring to FIGS. 3 to 11, a method for manufacturing a semiconductor package in accordance with an exemplary embodiment includes: a process of a first semiconductor chip structure 100, which includes a process of forming a first passivation layer 140 on a first unit circuit part (not shown) and a process of forming a conductive bump 160 on the first unit circuit part; a process of manufacturing a second semiconductor chip structure 200, which includes a process of forming a second passivation layer 240 on a second unit circuit part (not shown), a process of forming a stepped portion 245 that is recessed into the passivation layer 240, and a process of forming a bump pad 260 within the stepped portion 245; a process of stacking the first semiconductor chip structure 100 and the second semiconductor chip structure 200 so that the first passivation layer 140 faces the second passivation layer 240; and a process of bonding the conductive bump 160 to the bump pad 260 within the stepped portion 245.

Here, the process of manufacturing the first semiconductor chip structure 100 may include: a process of forming a first intermediate passivation layer 120 to provide an exposed region including an input/output pad 114 of the first unit circuit part on the first unit circuit part; a process of forming a first redistribution layer 130 on the first intermediate passivation layer 120 so as to be electrically connected to the input/output pad 114 of the first unit circuit part; a process of forming a first passivation layer 140 to provide an exposed region including an end of the first redistribution layer 130 on the first redistribution layer 130; and a process of forming a conductive bump 160 on the exposed region of the first passivation layer 140.

Also, the process of manufacturing the second semiconductor chip structure 200 may include: a process of forming a second intermediate passivation layer 220 to provide an exposed region including an input/output pad 214 of the second unit circuit part on the second unit circuit part; a process of forming a second redistribution layer 230 on the second intermediate passivation layer 220 so as to be electrically connected to the input/output pad 214 of the second unit circuit part; a process of forming a second passivation layer 240 to provide an exposed region including an end of the second redistribution layer 230 on the second redistribution layer 230; and a process of forming a bump pad 260 on the exposed region of the second passivation layer 240.

Referring to FIG. 3, in order to manufacture the first semiconductor chip structure 100, a silicon substrate 112 is formed first to prepare the first unit circuit part including the input/output pad 114 for electrical connection with an external circuit and a protective layer 116 formed on the silicon substrate 112 to expose the input/output pad 114.

Referring to FIG. 4, the first intermediate passivation layer 120 covering the input/output pad 114 and the protective layer 116 is formed on the first unit circuit part. The first intermediate passivation layer 120 may be formed through a coating or chemical vapor deposition process. After the first intermediate passivation layer is formed, the exposed region including the input/output pad 114 is formed on the first intermediate passivation layer 120. The exposed region may be formed through a laser drilling or photolithography process.

Thereafter, a first redistribution seed layer is formed on the first intermediate passivation layer 120 and the exposed region formed on the first intermediate passivation layer 120. The first redistribution seed layer may be formed through a chemical vapor deposition or physical vapor deposition process. Thereafter, a photoresist is applied on the first redistribution seed layer, and then, a process of patterning the photoresist is performed on an entire surface of the first redistribution seed layer to expose a region on which the first redistribution layer 130 will be formed. The photoresist may be patterned through the photolithography process including exposure and developing processes.

The first redistribution layer 130 is formed on the first redistribution seed layer that is exposed by the patterned photoresist. In order to form the first redistribution layer 130, an electroplating process using the first redistribution seed layer as a seed may be performed. When the first redistribution layer 130 is formed through an electroless plating process, the process of forming the first redistribution seed layer may be omitted.

Thereafter, the patterned photoresist is removed. Since the patterned photoresist is removed, a portion of the first redistribution seed layer on which the first redistribution layer 130 is not formed may be exposed. Also, the patterned photoresist may be removed through an ashing process. Then, a process of removing the portion of the first redistribution seed layer on which the first redistribution layer 130 is not formed is performed. The portion of the first redistribution seed layer may be removed through a wet etching process or a dry etching process. Here, the first redistribution layer 130 functions as an etching prevention layer for removing the portion of the first redistribution seed layer on which the first redistribution layer 130 is not formed.

Referring to FIG. 5, the first passivation layer 140 is formed on the first intermediate passivation layer 120 and the first redistribution layer 130. The first passivation layer 140 may be formed through a coating process. Thereafter, a process of patterning the first passivation layer 140 to form the exposed region including the end of the first redistribution layer 130 is performed. The exposed region of the first passivation layer 140 may correspond to a region on which the conductive bump 160 is disposed on the first redistribution layer 130. The exposed region of the first passivation layer 140 may be formed through a laser drilling process, a photolithography process, or the like.

Thereafter, a process of forming an under bump metal seed layer on the first passivation layer 140 and the end of the first redistribution layer 130 that is exposed by the exposed region of the first passivation layer 140 is performed. The under bump metal seed layer may be formed through a chemical vapor deposition or physical vapor deposition process.

Then, a photoresist is applied to an entire surface of the under bump metal seed layer, and then, a process of patterning the photoresist on the region, on which the conductive bump 160 is disposed, to expose a portion of the under bump metal seed layer is performed. The photoresist may be patterned through the photolithography process including exposure and developing processes.

Also, an under bump metal layer 150 is formed on a portion of the under bump metal seed layer that is exposed by the patterned photoresist, and a conductive bump 160 including a conductive pillar 162 and a conductive solder 164 is formed on the under bump metal layer 150. Here, the under bump metal layer 150 and the conductive bump 160 may be formed through an electroplating process. Also, when the under bump metal layer 150 is formed through the electroless plating process, the under bump metal seed layer may be omitted. Also, the conductive bump 160 may directly form the conductive solder on the under bump metal layer 150. In this case, the under bump metal layer 150 may be formed based on a ball drop process using a ball drop stencil or a screen printing process.

Thereafter, a process for removing the patterned photoresist is performed. Here, the patterned photoresist may be removed through an ashing process. Also, a process for removing the under bump metal seed layer that is exposed by removing the patterned photoresist is performed. Here, the conductive bump 160 functions as an etching prevention layer for removing the under bump metal seed layer. The under bump metal seed layer may be removed through dry etching or wet etching. Thereafter, a reflow process is performed to deform the conductive solder 164 formed on the conductive pillar 162 into a conductive solder 164 having a circular shape.

Although not shown, a process of applying a glue layer 300 on the first passivation layer 140 disposed around the conductive bump 160 may be performed. The glue layer 300 may be a layer formed by thermally curing liquid glue having certain viscosity in a thermal process of the liquid glue material. A common die attached film (DAF) tape may be used as the glue layer 300.

The first semiconductor chip structure 100 may be manufactured through the above-described processes.

FIGS. 6 to 10 are cross-sectional views illustrating a method for manufacturing the second semiconductor chip structure 200 in accordance with an exemplary embodiment.

Figure 6:
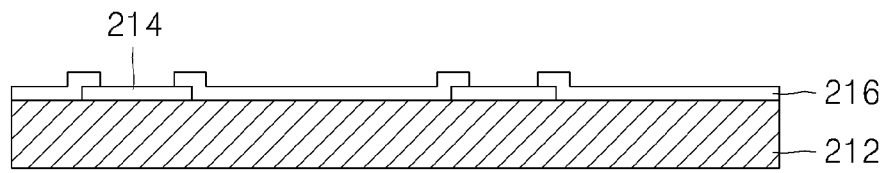
FIGS. 6 to 10 are cross-sectional views illustrating a method for manufacturing a second semiconductor chip structure in accordance with an exemplary embodiment.
Figure 7:
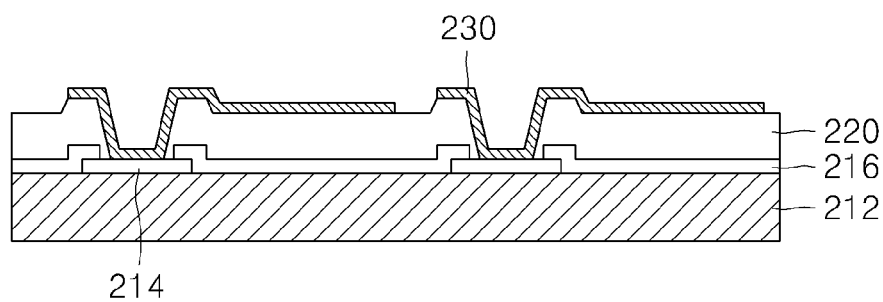

As illustrated in FIGS. 6 and 7, a process of forming a second intermediate layer 220 and a second redistribution layer 230 on a second unit circuit part in a method for manufacturing the second semiconductor chip structure 200 may be the same as that for forming the first intermediate passivation layer 120 and the first redistribution layer 130 in the manufacturing the first semiconductor chip structure 100.

Figure 8:
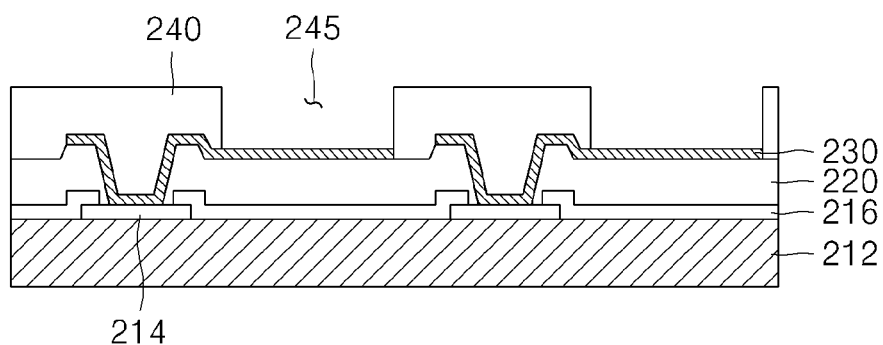

Referring to FIG. 8, a process for forming a second passivation layer 240 on the second intermediate passivation layer 220 and the second redistribution layer 230 is performed. As described above, the second passivation layer 240 may be formed through a coating process. Then, a process of patterning the second passivation layer 240 to form a stepped portion 245 that exposes an end of the second redistribution layer 230 on the second passivation layer 240 is performed. The stepped portion 245 may correspond to a region on which a bump pad 260 is disposed on the second distribution layer 230. The stepped portion 245 of the second passivation layer 240 may be formed through a laser drilling process, a photolithography process, or the like.

Figure 9:
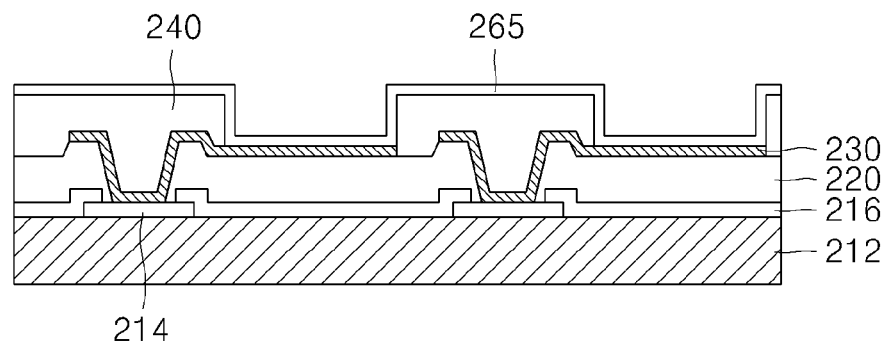

Referring to FIG. 9, a process of forming a bump pad seed layer on the second passivation layer 240 and the stepped portion 245 of the second passivation layer 240 is performed. The bump pad seed layer may be formed through a chemical vapor deposition or physical vapor deposition process. Thereafter, a process of forming a bump pad layer 265 is performed. The bump pad layer 265 may be formed on the bump pad seed layer through an electroplating process. When the bump pad layer 265 is formed through an electroless plating process, the bump pad seed layer may be omitted. Here, the bump pad layer 265 may be formed of a material having high conductivity such as copper. A nickel layer and a Pb-free solder layer that is the same the conductive solder may be successively stacked on the copper layer. Also, the bump pad layer 265 constituting the bump pad 260 includes the same component as the conductive bump 160 to improve wetting on an interface and also improve adhesion between the bump pad 260 and the conductive solder 164.

Figure 10:
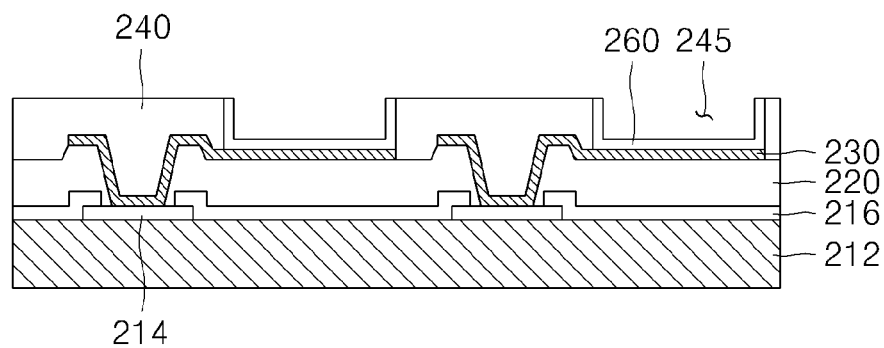

Referring to FIG. 10, a process of chemically mechanically polishing the patterned second passivation layer 240 and the bump pad layer formed on the second passivation layer 240 to form the stepped portion 245 is performed. The chemical mechanical polishing may be performed until a top surface of the second passivation layer 240 is exposed. Since the bump pad 260 is formed through the chemical mechanical polishing process, the bump pad 260 may extend to a side surface of the stepped portion 245. In this case, as described above, the conductive solder 164 bonded to the bump pad 260 may be maintained within the bump pad 260 having high adhesion to prevent the conductive solder 164 from being discharged out of the stepped portion 245.

The second semiconductor chip structure 200 may be manufactured through the above-described processes.

When the first semiconductor chip structure 100 and the second semiconductor chip structure 200 are manufactured, a glue layer is formed on at least one layer of the first and second passivation layers 140 and 240. Although the glue layer 300 is formed on the first passivation layer 140 in FIG. 11, the glue layer 300 may be formed on the second passivation layer 240 or all the first and second passivation layers 140 and 240. When the glue layer 300 is formed on a top surface of the second passivation layer 240, the glue layer 300 may be spaced near the conductive bump, and thus, the conductive bump 160 may flow into the spaced space between the glue layer 300 and the conductive bump 160 to prevent the conductive bump 160 from leaking out of the stepped portion 245.

Referring to FIGS. 11 and 12, the first and second semiconductor chip structures 100 and 200 are stacked so that the first passivation layer 140 faces the second passivation layer 240 to bond the first passivation layer 140 of the first semiconductor chip structure 100 to the second passivation layer 240 of the second semiconductor chip structure 200 by using the glue layer 300 formed on the first passivation layer 140 of the first semiconductor chip structure 100 as a medium. Here, the conductive bump 160 exposed from the first passivation layer 140 of the first semiconductor chip structure 100 is accommodated into the stepped portion 245 formed in the second passivation layer 240 of the second semiconductor chip structure 200 to contact the bump pad 260.

When a thermal compression process is performed at a predetermined temperature and pressure in the state in which the conductive bump 160 is in contact with the bump pad 260, the conductive bump 160 is fused to the bump pad 260, and the conductive bump 160 having flowability may be completely filled into the stepped portion 245 formed in the second passivation layer 240. Also, as described above, when the stepped portion 245 have a volume greater than that of the conductive bump 160, the glue layer 300 disposed between the first and second semiconductor chip structures 100 and 200 may be additionally filled into an air gap within the stepped portion 245 that is not completely filled with only the conductive bump 160 to completely fill the stepped portion 245 with the conductive bump 160 and the glue layer 300 without performing a separate underfill process.

According to the semiconductor package manufactured as described above, in the first and second passivation layers 140 and 240, which are adhered to each other by using the glue layer 300 as the medium, the conductive bump 160 bonded to the bump pad 260 may be accommodated in the stepped portion 160 and also be completely isolated from the conductive bump 160 bonded to the other adjacent bump pad 260. Thus, in a chip to chip, chip to wafer, or wafer to wafer bonding process, since a defect such as a bump bridge between the adjacent conductive bumps 160 is fundamentally prevented, it is advantageous in design of a fine bump pitch. Also, since the inside of the stepped portion 245, which is formed while the first and second passivation layers 140 and 240 are adhered to each other is completely filled with the conductive bump 160 or all the conductive bump and the glue layer 300, the occurrence of the air gap that cause the popcorn cracks may be effectively prevented without performing a separate underfill process.

Another Embodiment

Figure 13:
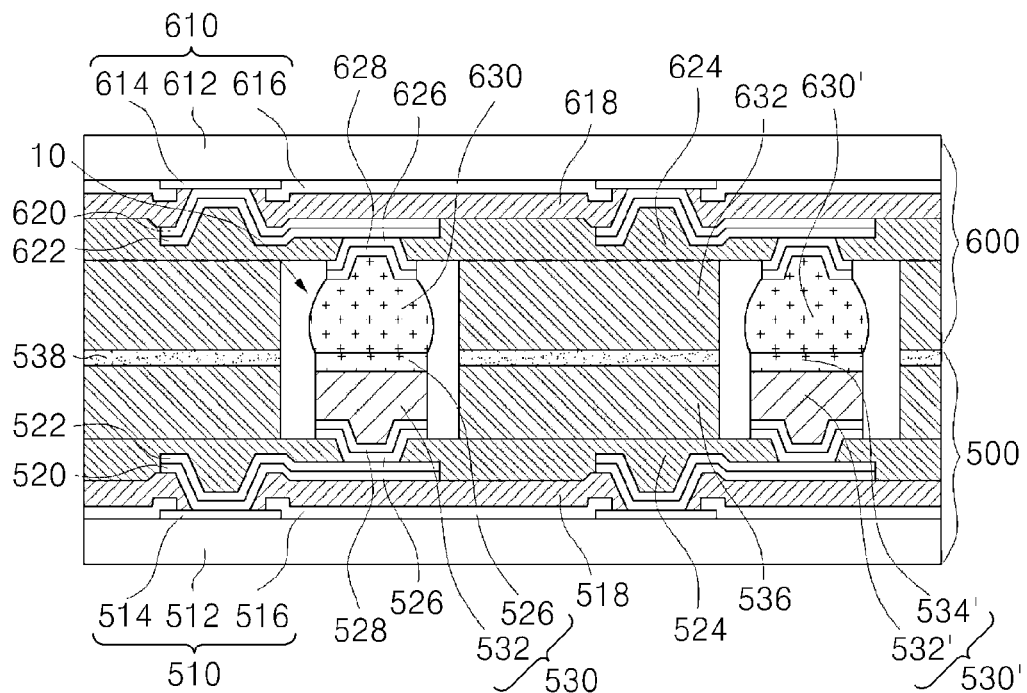
FIG. 13 is a cross-sectional view illustrating a cross-sectional surface of a semiconductor package according to another embodiment of the present invention.

FIG. 13 is a cross-sectional view illustrating a cross-sectional surface of a semiconductor package 700 in accordance with another embodiment.

Referring to FIG. 13, the semiconductor package 700 in accordance with another embodiment may include a bottom semiconductor chip structure 500 and a top semiconductor chip structure 600.

In the semiconductor package 700 in accordance with another embodiment, the bottom semiconductor chip structure 500 may be electrically bonded to the top semiconductor chip structure 600 by a bump B1 which is formed by bonding a bottom bump 530 of the bottom semiconductor chip structure 500 to a top bump 630 of the top semiconductor package 200.

A bump structure B1 (530 and 630), which is formed by bonding the bottom bump 530 of the bottom semiconductor chip structure 500 to the top bump 630 of the top semiconductor chip structure 600, may be isolated from a plurality of bump structures B2 (530' and 630'), which is formed by bonding another bottom bump 530' adjacent to the bottom bump 530 to another top bump 630' adjacent to the top bump 630, by a plurality of partition wall structures 536 and 632 which are formed by adhesion between a third bottom passivation layer 536 and a third top passivation layer 632.

In accordance with another embodiment, the partition wall structure fundamentally prevents a bump bridge from being formed between adjacent bump structures B1 and B2, and thus, a design of a fine bump pitch is not limited.

Hereinafter, the bottom semiconductor chip structure 500 and the top semiconductor chip structure 600 including the partition wall structure will be described in detail.

Bottom Semiconductor Chip Structure 500

The bottom semiconductor chip structure 500 in accordance with another embodiment may include a bottom unit circuit part 510, a first bottom passivation layer 518, a bottom redistribution seed layer 520, a bottom redistribution layer 522, a second bottom passivation layer 524, a bottom under bump metal (UBM) seed layer 526, a bottom UBM layer 528, a bottom bump 530 (532 and 534), a third bottom passivation layer 536, and a glue layer 538.

The unit circuit part may represent a semiconductor stacking body for performing functions such as information conversion, storage, and operation and a line structure thereof. The bottom unit circuit part (510) may be disposed on a substrate 512 or a wafer and further include the input/output pad 514 electrically connected to an external circuit and a protective layer 516 exposing the input/output pad 514 and protecting the unit circuit part.

The first bottom passivation layer 518 may be formed on the bottom unit circuit part 510 to expose the input/output pad 514. A material of the first bottom passivation layer 518 may be formed of any one selected from among polyimide (PI), benzo cyclo butene (BCB), poly benz oxazole (PBO), bismaleimideTriazine (BT), phenolic resin, epoxy, silicon, $SiO_2$, $Si_3N_4$, and an equivalent material thereof, but is not limited thereto.

The bottom redistribution seed layer 520 may be formed on the input/output pad 514, which is exposed by the first bottom passivation layer 518, and the first bottom passivation layer 518. The bottom redistribution seed layer 520 may function as a seed for forming the bottom redistribution layer 522. That is, when the bottom redistribution layer 522 is formed through an electroplating process, the bottom redistribution seed layer 520 may provide a path through which a current flows, and thus may function as the seed for forming the bottom redistribution layer 122 thereon. However, when the bottom redistribution layer 522 is formed through an electroless plating process, the bottom redistribution seed layer 520 may be omitted.

The bottom redistribution layer 522 may be formed on the bottom redistribution seed layer 522, and when the bottom redistribution seed layer 522 is omitted, the bottom redistribution layer 522 may be formed on the input/output pad 514, exposed by the first bottom passivation layer 518, and the first bottom passivation layer 518.

The bottom redistribution layer 522 may redistribute an electrical path of the bottom unit circuit part 510. That is, the bottom redistribution layer 522 may redistribute a path for electrically connecting the input/output pad 514 to the bottom bump 530 irrespective of a position of the input/ output pad 514. A material of the bottom redistribution layer 522 may be copper (Cu) or an equivalent material thereof.

The second bottom passivation layer 524 may be formed on the first bottom passivation layer 518 and the bottom redistribution layer 522 and may include an opening region that exposes a partial region of the bottom redistribution layer 522.

The partial region of the bottom redistribution layer 522 exposed by the opening region of the second bottom passivation layer 524 may provide a path that electrically connects the bottom redistribution layer 522 to the bottom bump 530.

A material of the second bottom passivation layer 524 may be formed of any one selected from among polyimide (PI), benzo cyclo butene (BCB), poly benz oxazole (PBO), bismaleimideTriazine (BT), phenolic resin, epoxy, silicon, $SiO_2$, $Si_3N_4$, and an equivalent material thereof, but is not limited thereto.

The bottom UBM seed layer 526 may be formed in the partial region of the bottom redistribution layer 522 exposed by the opening region of the second bottom passivation layer 524. When the bottom UBM seed layer 526 is formed through the electroplating process, the bottom UBM seed layer 526 may provide a path through which a current flows. A material of the bottom UBM seed layer 526 may be Cu or an equivalent material thereof.

The bottom UBM layer 528 may be formed on the bottom UBM seed layer 526. The bottom UBM layer 528 may be provided for reinforcing an adhesive force between the bottom redistribution layer 522 and the bottom bump 530.

In FIG. 13, although the bottom UBM layer 528 is illustrated as one layer, the bottom UBM layer 528 may substantially have a structure which is formed by coupling of a plurality of layers. A material of the bottom UBM layer 528 may be Cr/Cr-Cu/Cu, Ti—W/Cu, Al/Ni/Cu, and an equivalent material thereof.

The bottom bump 530 may be formed on the bottom UBM layer 528 and may be adhered to the top bump 630 of the top semiconductor chip structure 600. Since the bottom bump 530 is adhered to the top bump 630, the bottom semiconductor chip structure 500 may be electrically connected to the top semiconductor chip structure 600.

The bottom bump 530 may be a copper pillar bump or a solder bump. When the bottom bump 530 is the copper pillar bump, the bottom bump 30 may include a copper pillar layer 532 and a solder layer 534.

The copper pillar layer 532 may be formed on the bottom UBM layer 528 through the electroplating process.

The solder layer 534 may be formed as a thin film type on the copper pillar layer 532 through the electroplating process and may function as a junction layer to be easily adhered to the top bump 630 of the top semiconductor chip structure 600.

A material of the solder layer 534 may be Sn, SnAg, Sn—Pb, SnAgCu, SnAgZn, SnZn, SnBi—In, Sn—In, Sn—Au, SnPb, SnCu, SnZnIn, SnAgSb, or the like. The solder layer 534 may be referred to as a solder cap.

Although not shown, a diffusion barrier layer may be disposed between the copper pillar layer 532 and the solder layer 534. The diffusion barrier layer prevents copper of the copper pillar layer 532 from being diffused to the solder layer 534. A material of the diffusion barrier layer may be Ni, Ni(P), Ni(V), or the like.

The third bottom passivation layer 536 may be formed on the second bottom passivation layer 524 with the bottom bump 530 therebetween to have a thickness (a height) which is slightly less than a thickness (a height) of the bottom bump 530. Therefore, the bottom bump 530 may be isolated from the bottom bump 530' adjacent thereto by the third bottom passivation layer 536.

A material of the third bottom passivation layer 536 may be formed of any one selected from among polyimide (PI), benzo cyclo butene (BCB), poly benz oxazole (PBO), bismaleimideTriazine (BT), phenolic resin, epoxy, silicon, $SiO_2$, $Si_3N_4$, and an equivalent material thereof, but is not limited thereto.

The glue layer 538 may be formed on the third bottom passivation layer 536. The bottom semiconductor chip structure 500 may be adhered to the top semiconductor chip structure 600 by the glue layer 538.

The glue layer 538 may be a layer which is formed by thermally curing liquid glue which has certain viscosity and is coated on the third bottom passivation layer 536. Here, the liquid glue may be a nonconductive material in electricity, and for example, may be a thermosetting resin, such as epoxy, or a thermoplastic resin such as polyether amid or polyimide siloxane.

Top Semiconductor Chip Structure 600

The top semiconductor chip structure 600 in accordance with another embodiment may include a top unit circuit part 610, a first top passivation layer 618, a top redistribution seed layer 620, a top redistribution layer 622, a second top passivation layer 624, a top UBM seed layer 626, a top UBM layer 628, a top bump 630, and a third top passivation layer 632.

An internal structure of the top semiconductor chip structure 600 may be the same as that of the bottom semiconductor chip structure 500. The top semiconductor chip structure 600 merely has differences with the bottom semiconductor chip structure 500 in that the top bump 630 included in the top semiconductor chip structure 600 is a solder bump and the glue layer 538 included in the bottom semiconductor chip structure 500 is omitted.

Therefore, the descriptions of the bottom unit circuit part 510, the first bottom passivation layer 518, the bottom redistribution seed layer 520, the bottom redistribution layer 522, the second bottom passivation layer 524, the bottom UBM seed layer 526, and the bottom UBM layer 528 included in the bottom semiconductor chip structure 500 may be applied to the top unit circuit part 610, the first top passivation layer 618, the top redistribution seed layer 620, the top redistribution layer 622, the second top passivation layer 624, the top UBM seed layer 626, the top UBM layer 628, and the top bump 630 included in the top semiconductor chip structure 600.

The top bump 630 which is implemented as the solder bump may be formed on the top UBM layer 628. A material of the top bump 630 may be Sn, SnAg, Sn—Pb, SnAgCu, SnAgZn, SnZn, SnBi—In, Sn—In, Sn—Au, SnPb, SnCu, SnZnIn, SnAgSb, or the like.

The third top passivation layer 632 may be formed on the second top passivation layer 624 with the top bump 630 therebetween to have a thickness (a height) which is slightly less than a thickness (a height) of the top bump 630. Therefore, the top bump 630 may be isolated from the top bump 630' adjacent thereto by the third top passivation layer 632.

Through a bonding process, the third top passivation layer 632 may be adhered to the third bottom passivation layer 538 by the glue layer 538 formed on the third bottom passivation layer 538, and the top bump 630 may be joined to the bottom bump 530, thereby manufacturing the semiconductor package in accordance with another embodiment.

A partition wall which is formed by a junction of the third bottom passivation layer 536 and the third top passivation layer 632 may completely isolate the other bottom bump 530' adjacent to the bottom bump 530 and the other top bump 630' adjacent to the top bump 630 from the bump B1 which is formed by a junction of the bottom bump 530 and the top bump 630, thereby fundamentally preventing a defect where a bump bridge or short circuit occurs between the bump B1 and the bump B2. Accordingly, there is no limitation in designing a fine bump pitch.

Moreover, as illustrated in FIG. 13, an air gap 10 may be formed in the semiconductor package 700 due to the partition wall which is formed by the junction of the third bottom passivation layer 536 and the third top passivation layer 632.

While a manufacturing process is being performed, moisture can penetrate into the air gap 10. The moisture penetrating into the air gap 10 may be gasified by high heat which occurs in the manufacturing process, and vapor pressure in the air gap 10 may rise in an operation where the moisture is gasified. The excessive rising of the vapor pressure causes a popcorn crack, causing a defective package.

In order to prevent the popcorn crack, specific materials may be filled into the air gap 10 in order for the moisture not to penetrate into the air gap 10 while the manufacturing process is being performed.

Figure 14:
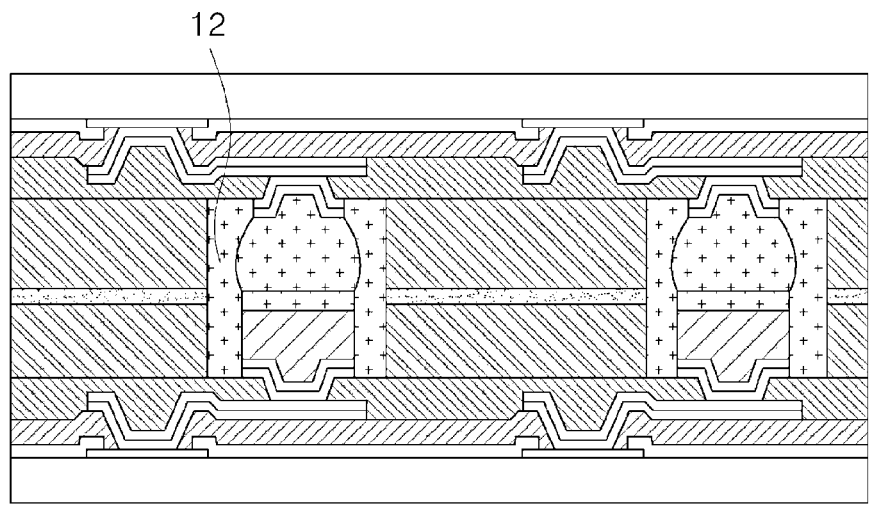
FIG. 14 is a cross-sectional view illustrating a cross-sectional surface of a semiconductor package according to another embodiment of the present invention.

Therefore, in a semiconductor package according to another embodiment of the present invention, as illustrated in FIG. 14, the materials filled into the air gap 10 may be, for example, Sn-based solders 12. In this case, the solder material filled into the air gap 10 may be the same as a material of the top bump (the solder bump).

Figure 15:
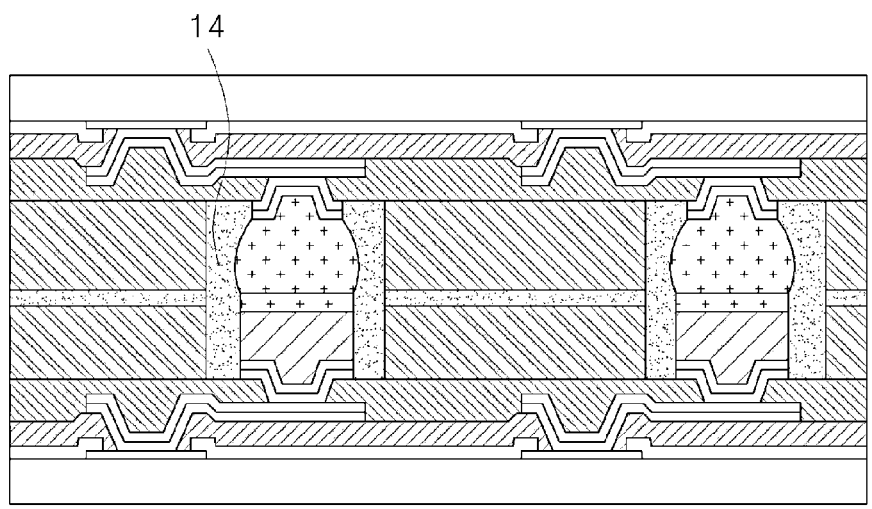
FIG. 15 is a cross-sectional view illustrating a cross-sectional surface of a stacked semiconductor package according to another embodiment of the present invention.

As illustrated in FIG. 15, another material filled into the air gap 10 may be, for example, a glue material 14 which is the same as a material of the glue layer 538 formed on the third bottom passivation layer 536.

As described above, a material which is the same as the Sn-based solder material or a material of the glue layer 538 is filled into the air gap 10, thereby preventing a popcorn crack from occurring due to moisture which penetrates into the air gap 10.

FIGS. 16 to 38 are cross-sectional views illustrating a method of manufacturing a semiconductor package in accordance with another embodiment.

Figure 16:
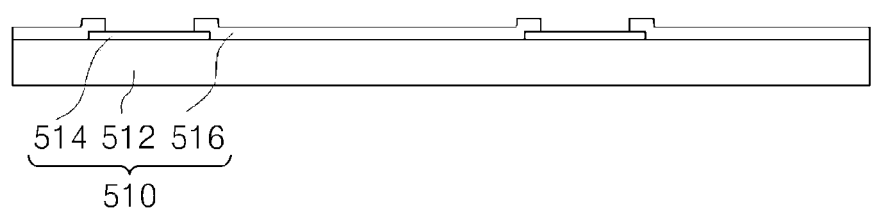
FIGS. 16 to 38 are cross-sectional views illustrating a method of manufacturing a semiconductor package according to another embodiment of the present invention.

First, referring to FIG. 16, a silicon substrate 512 is formed first to prepare the bottom unit circuit part 510 including the input/output pad 514 for electrical connection with an external circuit and a protective layer 516 formed on the silicon substrate 512 to expose the input/output pad 514.

Figure 17:
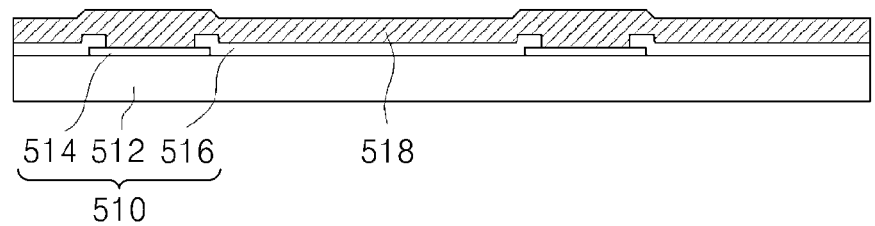

Subsequently, referring to FIG. 17, a process of forming the first bottom passivation layer 518, covering the input/output pad 514 and the protective layer 516, all over the bottom unit circuit part 510 may be performed. A method of forming the first bottom passivation layer 518 may use a coating process or a chemical vapor deposition (CVD) process.

A material of the first bottom passivation layer 518 may be formed of any one selected from among polyimide (PI), benzo cyclo butene (BCB), poly benz oxazole (PBO), bismaleimideTriazine (BT), phenolic resin, epoxy, silicon, $SiO_2$, $Si_3N_4$, and an equivalent material thereof, but is not limited thereto.

Figure 18:
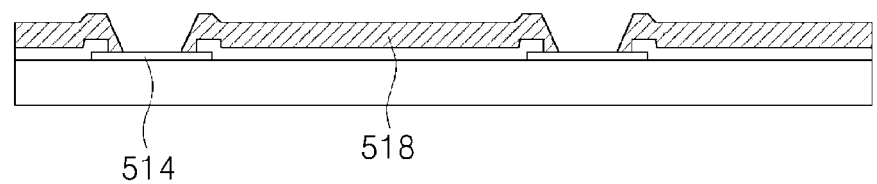

Subsequently, referring to FIG. 18, a process of forming an opening region, exposing the input/output pad 514, in the first bottom passivation layer 518 may be performed. The process of forming the opening region in the first bottom passivation layer 518 may use a laser drilling process, a photolithography process, and/or the like.

Figure 19:
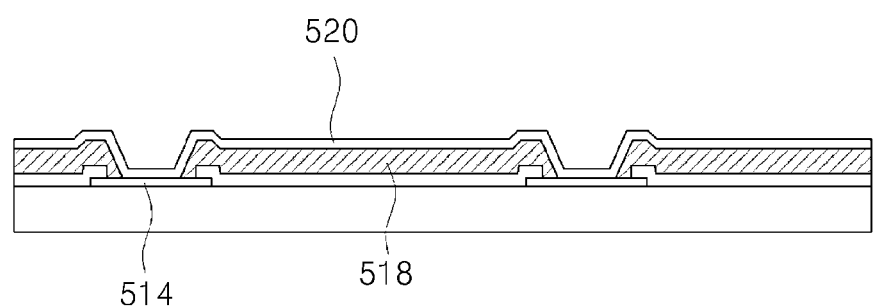

Subsequently, referring to FIG. 19, a process of forming the bottom redistribution seed layer 520 on the input/output pad 514 exposed by the opening region formed in the first bottom passivation layer 518 may be performed. The process of forming the bottom redistribution seed layer 520 may use a CVD process, a physical vapor deposition (PVD), process, and/or the like.

Figure 20:
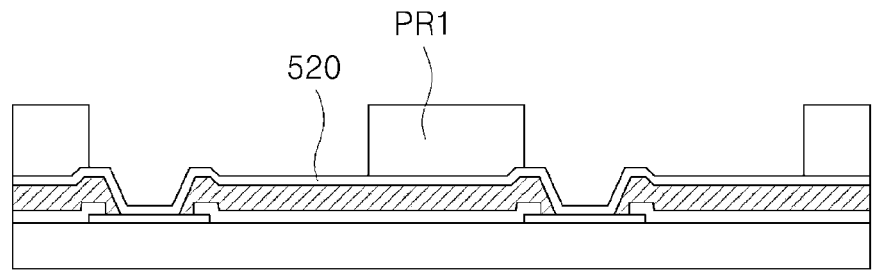

Subsequently, referring to FIG. 20, a first photoresist PR1 may be coated on the bottom passivation seed layer 520, and a process of patterning the first photoresist PR1 all over the bottom passivation seed layer 520 to expose a region where the bottom passivation layer 522 is to be formed may be performed. The process of patterning the first photoresist PR1 may use a photolithography process which includes an exposure process and a development process.

Figure 21:
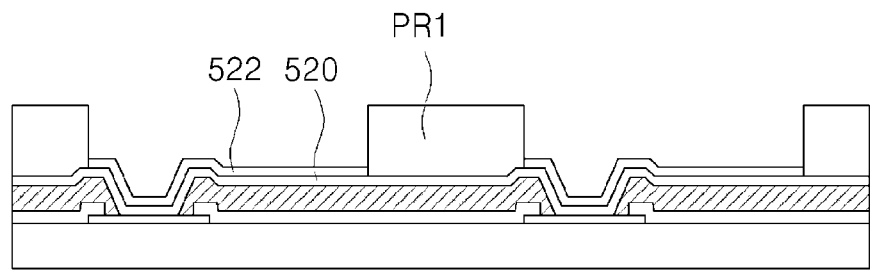

Subsequently, referring to FIG. 21, a process of forming the bottom passivation layer 522 on the bottom passivation seed layer 520 exposed by the patterned first photoresist PR1 may be performed. The process of forming the bottom passivation layer 522 may use an electroplating process that uses the bottom passivation seed layer 520 as a seed. In this case, in a case of forming the bottom passivation layer 522 through an electroless plating process, the bottom passivation seed layer 520 may be removed.

Figure 22:
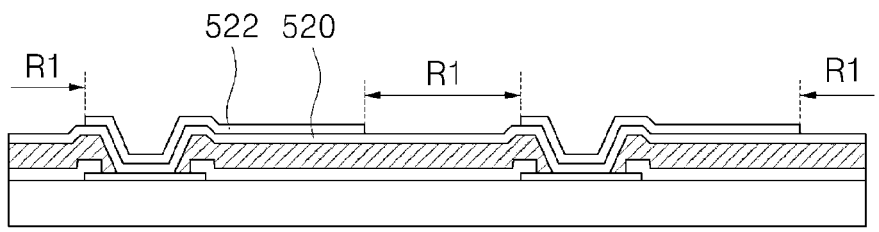

Subsequently, referring to FIG. 22, a process of removing the patterned first photoresist PR1 may be performed. Since the patterned first photoresist PR1 is removed, a partial region R1 of the bottom passivation seed layer 520 may be exposed. The process of removing the patterned first photoresist PR1 may use an ashing process.

Figure 23:
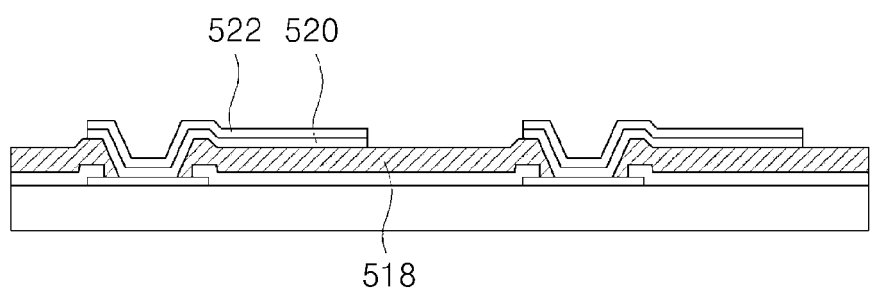

Subsequently, referring to FIG. 23, a process of removing the partial region R1 of the bottom passivation seed layer 520 which is exposed by removing the patterned first photoresist PR1 may be performed. The process of removing the partial region R1 of the bottom passivation seed layer 520 may use a wet etching process or a dry etching process. In this case, the bottom passivation layer 522 may act as an etch stop layer for removing the partial region R1 of the bottom passivation seed layer 520.

Figure 24:
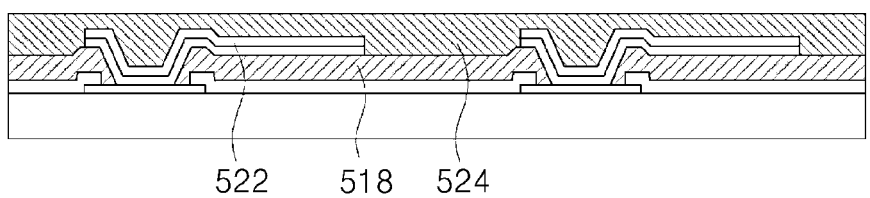

Subsequently, referring to FIG. 24, a process of forming the second bottom passivation layer 524 on the bottom passivation layer 522 and the first bottom passivation layer 518 exposed by removing the partial region R1 of the bottom passivation seed layer 520 may be performed. The process of forming the second bottom passivation layer 524 may use a coating process. A material of the second bottom passivation layer 524 may be formed of any one selected from among polyimide (PI), benzo cyclo butene (BCB), poly benz oxazole (PBO), bismaleimideTriazine (BT), phenolic resin, epoxy, silicon, $SiO_2$, $Si_3N_4$, and an equivalent material thereof, but is not limited thereto.

Figure 25:
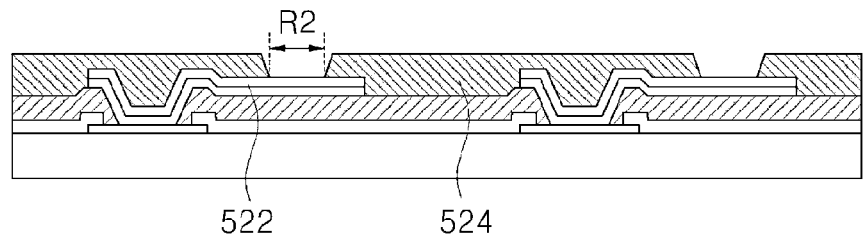

Subsequently, referring to FIG. 25, a process of patterning the second bottom passivation layer 524 to form an opening region R2, exposing the redistribution layer 522, in the second bottom passivation layer 524 may be performed. The opening region R2 may correspond to a region, where the bottom bump 530 (532 and 534) is disposed, on the redistribution layer 522. The process of forming the opening region in the bottom passivation layer 524 may use a laser drilling process, a photolithography process, and/or the like.

Figure 26:
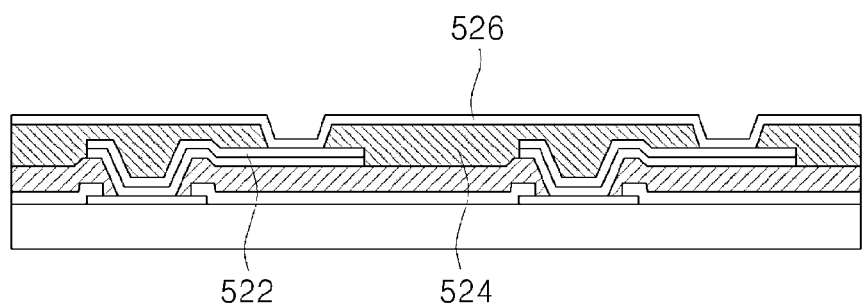

Subsequently, referring to FIG. 26, a process of forming the UBM seed layer 526 on the redistribution layer 522 exposed by the opening region R2 of the second bottom passivation layer 524 may be performed. The process of forming the UBM seed layer 526 may use a CVD process, a PVD process, and/or the like.

Subsequently, referring to FIG. 27, a second photoresist PR2 may be coated all over the UBM seed layer 526, and a process of patterning the second photoresist PR2 to expose a partial region of the UBM seed layer 526 corresponding to a region where the bottom bump 530 (532 and 534) is disposed may be performed. The process of patterning the second photoresist PR2 may use a photolithography process which includes an exposure process and a development process.

Subsequently, referring to FIG. 28, a process of forming the UBM layer 528 on a partial region of the UBM seed layer 526 exposed by the patterned second photoresist PR2 and forming the bottom bump 530 (532 and 534), including the copper pillar layer 532 and the solder layer (or a solder cap) 534, on the UBM layer 528 may be performed. The process of forming the UBM layer 528 and the bottom bump 530 (532 and 534) may use an electroplating process. Here, in a case of forming the UBM layer 528 through an electroless plating process, the UBM seed layer 526 may be omitted. In this case, the third bottom passivation layer 536 may be directly formed on the second bottom passivation layer 524.

A material of the copper pillar layer 532 may be copper or an equivalent material thereof. A material of the solder layer 534 may be Sn, SnAg, Sn—Pb, SnAgCu, SnAgZn, SnZn, SnBi—In, Sn—In, Sn—Au, SnPb, SnCu, SnZnIn, SnAgSb, or the like.

Although not shown, the diffusion barrier layer which prevents copper of the copper pillar layer 532 from being diffused to the solder layer 534 may be additionally disposed between the copper pillar layer 532 and the solder layer 534. In this case, a material of the diffusion barrier layer may be Ni, Ni(P), Ni(V), or the like.

Figure 29:
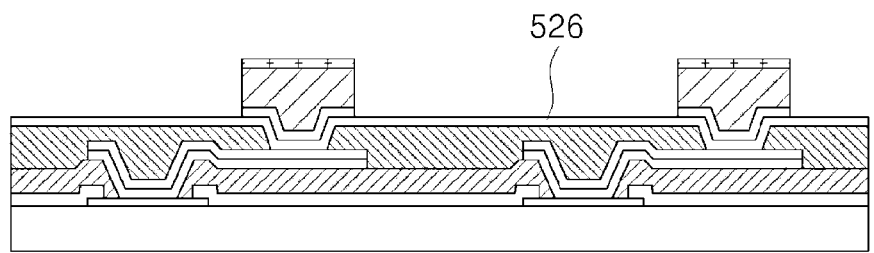

Subsequently, referring to FIG. 29, a process of removing the patterned second photoresist PR2 may be performed. The process of removing the patterned second photoresist PR2 may use an ashing process.

Figure 30:
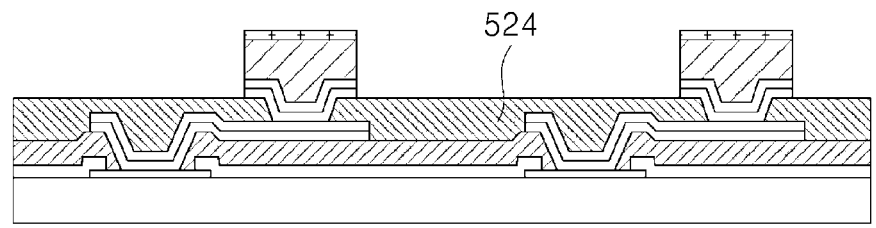

Subsequently, referring to FIG. 30, a process of removing the UBM seed layer 526 which is exposed by removing the patterned second photoresist PR2 may be performed. In this case, the bottom bump 530 which includes the copper pillar layer 532 and the solder layer 534 may act as an etch stop layer for removing the UBM seed layer 526. The process of removing the UBM seed layer 526 may use a wet etching process or a dry etching process.

Figure 31:
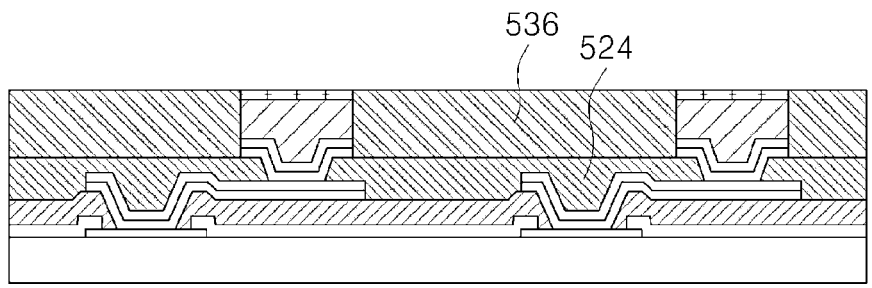

Subsequently, referring to FIG. 31, a process of forming the third bottom passivation layer 536 on the second bottom passivation layer 524 which is exposed by removing the UBM seed layer 526 may be performed. In this case, when the UBM seed layer 526 is omitted in a manufacturing process in accordance with another embodiment, the third bottom passivation layer 536 may be directly formed on the second bottom passivation layer 526 which is exposed by removing the patterned second photoresist PR2.

An upper surface of the third bottom passivation layer 536 may be formed to have a uniform thickness (a height), and a thickness (or a height) of the third bottom passivation layer 536 may be equal to or slightly less than a thickness (a height) of the bottom bump 530. A process of forming the third passivation layer 536 may use a coating process. A height of the third bottom passivation layer 536 may be adjusted by setting process variables such as a process time, a process temperature, and/or the like.

Figure 32:
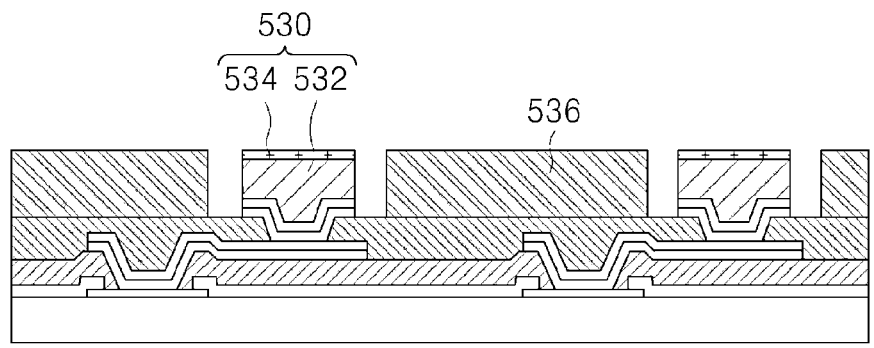

Subsequently, referring to FIG. 32, a process of forming a bottom opening region, having a width broader than that of the bottom bump 530 (532 and 534), on the third bottom passivation layer 536 may be performed so as to form a certain space near the bottom bump 530 (532 and 534).

The process of forming the bottom opening region may use a laser drilling process, a photolithography process, and/or the like. A width of the bottom opening region may be obtained by appropriately selecting a process variable such as light intensity, a light irradiation time, or the like which is used in the laser drilling process or the photolithography process.

A material of the third bottom passivation layer 536 may be formed of any one selected from among polyimide (PI), benzo cyclo butene (BCB), poly benz oxazole (PBO), bismaleimideTriazine (BT), phenolic resin, epoxy, silicon, $SiO_2$, $Si_3N_4$, and an equivalent material thereof, but is not limited thereto.

Figure 33:
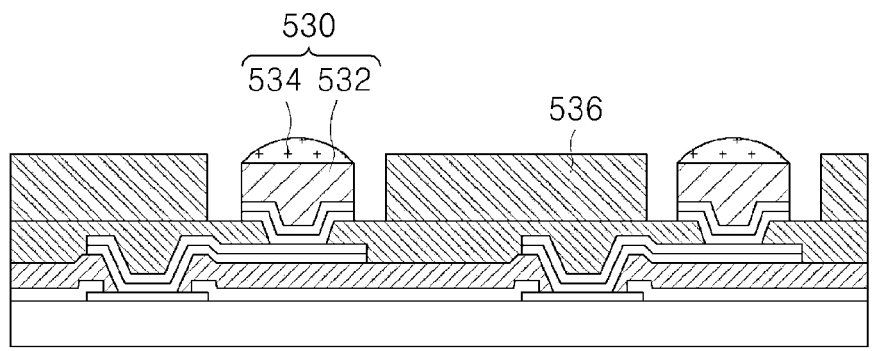

Subsequently, referring to FIG. 33, the solder layer 534 formed on the copper pillar layer 532 may be modified to a round-shaped solder layer 534 by performing a reflow process.

Figure 34:
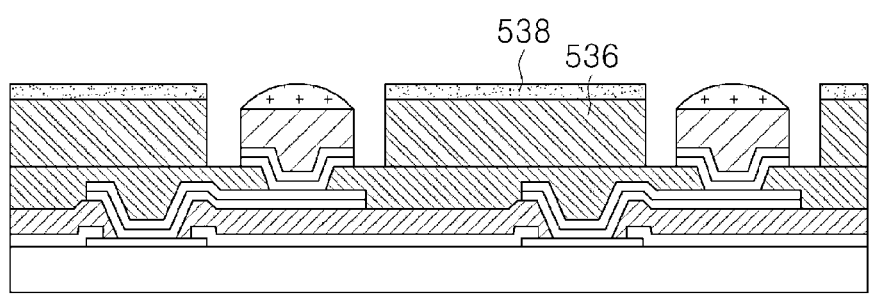

Subsequently, referring to FIG. 34, a process of coating the glue layer 538 on the third bottom passivation layer 536 surrounding the bottom bump 530 (532 and 534) may be performed. The glue layer 538 may be a layer which is formed by thermally curing liquid glue having certain viscosity through a thermal treatment process. Here, the liquid glue may be a nonconductive material in electricity, and for example, may be a thermosetting resin, such as epoxy, or a thermoplastic resin such as polyether amid or polyimide siloxane. The glue layer 538 may use a die attach film (DAF) tape.

When the glue layer 538 is coated on the third bottom passivation layer 536, the bottom semiconductor chip structure 500 may be finished.

Figure 35:
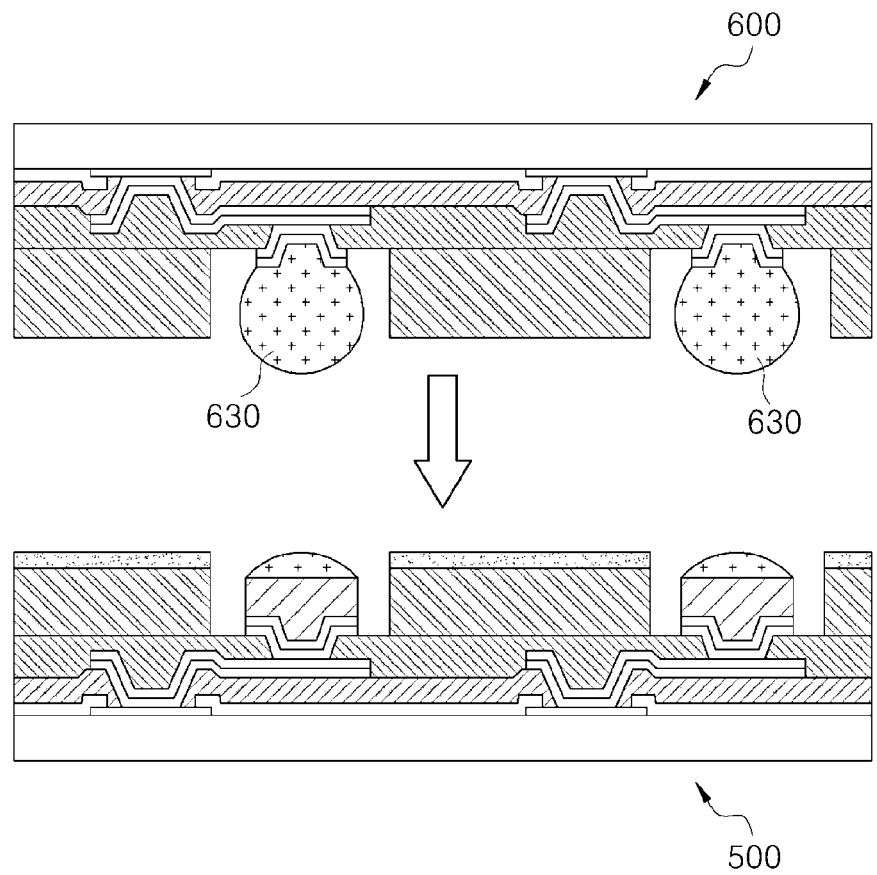

Subsequently, referring to FIG. 35, a process of bonding the bottom semiconductor chip structure 500 to the top semiconductor chip structure 600 may be performed. A process of manufacturing the bottom semiconductor chip structure 500 may be the same as a process of manufacturing the top semiconductor chip structure 600. In the present embodiment, the bottom semiconductor chip structure 500 and the top semiconductor chip structure 600 merely have a difference in that the bottom bump 530 of the bottom semiconductor chip structure 500 is the copper pillar bump and the top bump 630 is the solder bump.

Therefore, the process of manufacturing the top semiconductor chip structure 600 may be the same as the process of manufacturing the bottom semiconductor chip structure 500 described above with reference to FIGS. 16 to 27, and has a small difference in the process of forming the bottom bump 530 of the bottom semiconductor chip structure 500 described above with reference to FIGS. 27 to 34.

However, a process of forming the top bump 630 of the top semiconductor chip structure 600 hardly differ from the process of forming the bottom bump 530 of the bottom semiconductor chip structure 500 described above with reference to FIGS. 27 to 34. That is, in FIGS. 27 to 34, the bottom bump 530 which includes the copper pillar layer 532 and the solder layer 534 and is formed in the opening region of the second photoresist PR2 is replaced with the solder bump 630 formed of an Sn-based solder material, and the process of forming the top bump 630 of the top semiconductor chip structure 600 can be easily understood by those skilled in the art.

Figure 27:
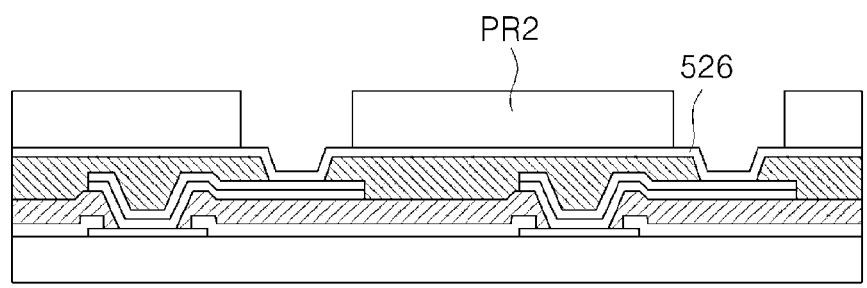
Figure 28:
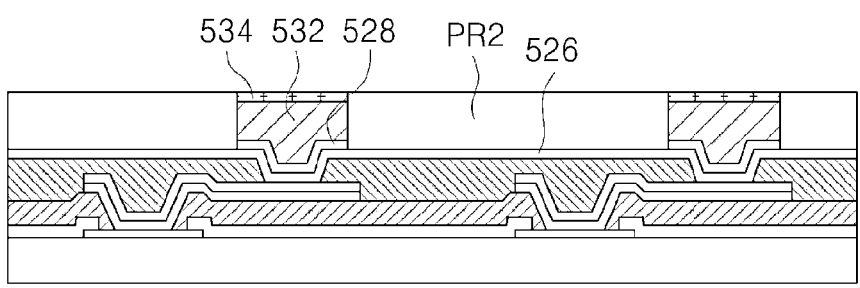

The top bump 630 of the top semiconductor chip structure 600 may be formed without the photoresist structure PR2 illustrated in FIGS. 27 and 28, and for example, may be formed on the top UBM layer 622 (see FIG. 13) through a ball drop process using a ball drop stencil or a screen printing process.

As described above, when the bottom semiconductor chip structure 500 including the copper pillar bump (the bottom bump) and the top semiconductor chip structure 600 including the solder bump (the top bump) are finished, the third bottom passivation layer 536 of the bottom semiconductor chip structure 500 may be adhered to the third top passivation layer 632 of the top semiconductor chip structure 600 by the glue layer 538 which is coated on the third bottom passivation layer 536 of the bottom semiconductor chip structure 500. In this case, the bottom bump 530 of the bottom semiconductor chip structure 500 may contact the top bump 630 of the top semiconductor chip structure 600.

When a thermal treatment process is performed at a certain temperature in a state where the bottom bump 530 contacts the top bump 630, the bottom bump 530 may be bonded to the top bump 630. Through such a bonding process, the semiconductor package 700 illustrated in FIG. 36 may be finished.

In the semiconductor package 700 which has been finished in this way, the third bottom passivation layer 536 and the third top passivation layer 632 which are adhered to each other by the glue layer 538 may act as partition wall structures which completely isolate a bump, which is formed by bonding the bottom bump 530 to the top bump 630, from an adjacent bump which is formed by bonding another bottom bump adjacent to the bottom bump 530 to another top bump adjacent to the top bump 630.

Figure 36:
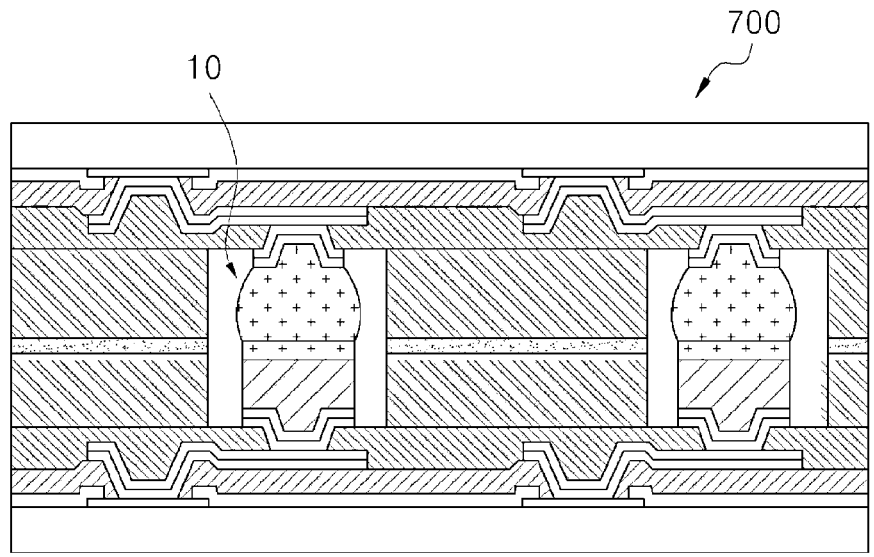

Therefore, in a C2C or C2W bonding process, a defect where a bump bridge occurs between adjacent bumps is fundamentally prevented, and thus, a fine bump pitch is easily designed. Also, as illustrated in FIG. 36, the air gap 10 (i.e., the air gap 10 which is formed by a bottom opening region formed in the third bottom passivation layer 536 and a top opening region formed in the third top passivation layer 632) which is formed in a process of bonding the third bottom passivation layer 536 to the third top passivation layer 632 can cause a popcorn crack.

Figure 37:
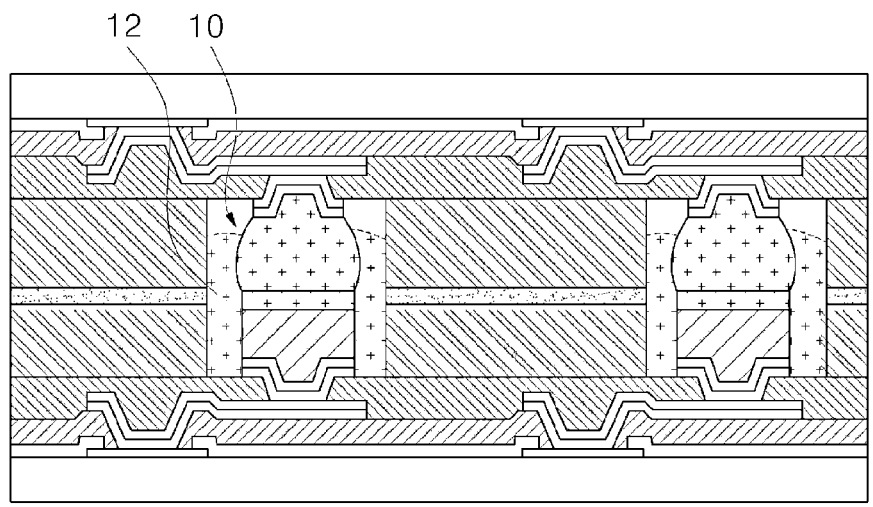
Figure 38:
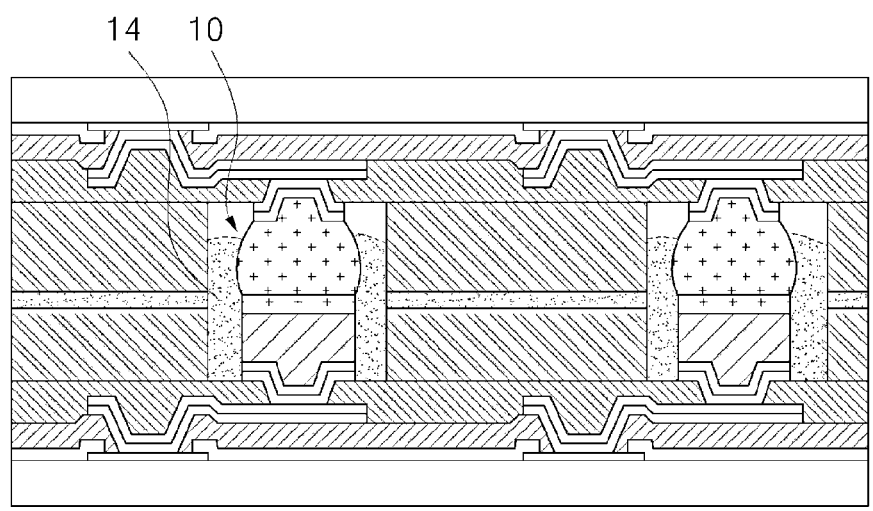

Therefore, in a method of manufacturing a semiconductor package according to another embodiment of the present invention, as illustrated in FIG. 37 or 38, an underfill process of filling a specific underfill material into the air gap 10 may be further performed. That is, a process of filling an Sn-based solder material 12 into the air gap 10 as the specific underfill material may be further performed as illustrated in FIG. 37, or a process of filling a glue material 14, which is the same as a material of the glue layer 538, into the air gap 10 as the specific underfill material may be further performed as illustrated in FIG. 38.

In the semiconductor package and the method for manufacturing the same in accordance with the exemplary embodiments, the semiconductor chip structures may be stacked so that the conductive bump of the first semiconductor chip structure is bonded to the bump pad within the stepped portion formed on the second passivation layer of the second semiconductor chip structure to prevent the bump bridge from being formed between the adjacent conductive bumps and effectively realize the fine bump pitch.

Furthermore, the first passivation layer of the first semiconductor chip structure and the second passivation layer of the second semiconductor chip structure may be adhered by the glue layer to more effectively prevent the conductive bump that is thermally compressed within the stepped portion from being discharged to the outside.

Also, since the bump pad that is buried in the stepped portion of the second passivation layer, not the connection between the conductive bumps, is used for the electrical connection between the semiconductor chip structures, the thickness of the semiconductor package may be minimized, and also, the adjacent bump pads and the adjacent conductive bumps may be completely isolated from each other.

In addition, the inside of the stepped portion formed on the second passivation layer may be filled with the conductive bump or glue layer that is melted by the thermal compression. Thus, the occurrence of the air gap, which causes the popcorn cracks, may be effectively prevented without performing the separate underfill process.

Although the specific embodiments are described and illustrated by using specific terms, the terms are merely examples for clearly explaining the embodiments, and thus, it is obvious to those skilled in the art that the embodiments and technical terms can be carried out in other specific forms and changes without changing the technical idea or essential features. Therefore, it should be understood that simple modifications according to the embodiments of the present invention may belong to the technical spirit of the present invention.

What is claimed is:

1. A semiconductor package comprising:
 a first semiconductor chip structure comprising a first unit circuit part, a first passivation layer disposed on the first unit circuit part, and a conductive bump electrically connected to the first unit circuit part; and
 a second semiconductor chip structure comprising a second unit circuit part, a second passivation layer having a stepped portion that is recessed inward and disposed on the second unit circuit part, and a bump pad provided in the stepped portion, wherein the bump pad is not outside the stepped portion; and
 a glue layer provided between the first and second passivation layers,
 wherein the first semiconductor chip structure and the second semiconductor chip structure are stacked to allow the conductive bump to be bonded to the bump pad within the stepped portion,
 wherein the stepped portion has a volume greater than that of the conductive bump exposed from the first passivation layer, and
 wherein the glue layer is filled into a gap in the stepped portion, which is not filled by the conductive bump.

2. The semiconductor package of claim 1, wherein the conductive bump comprises a conductive pillar and a conductive solder disposed on the conductive pillar.

3. The semiconductor package of claim 2, wherein the conductive pillar has a height greater than a thickness of the glue layer.

4. The semiconductor package of claim 1, wherein the glue layer is spaced near the conductive bump.

5. The semiconductor package of claim 1, wherein the bump pad extends to cover a bottom surface and a sidewall of at least a portion of the stepped portion.

6. The semiconductor package of claim 1, wherein the bump pad and the conductive bump comprise the same component.

7. A method for manufacturing a semiconductor package, the method comprising:
 manufacturing a first semiconductor chip structure, which comprises forming a first passivation layer on a first unit circuit part and forming a conductive bump electrically connected to the first unit circuit part;

manufacturing a second semiconductor chip structure, which comprises forming a second passivation layer on a second unit circuit part, forming a stepped portion that is recessed into the passivation layer to have a volume greater than that of the conductive bump exposed from the first passivation layer, and forming a bump pad within the stepped portion such that the bump pad is not outside the stepped portion;

forming a glue layer on at least one layer of the first and second passivation layers;

stacking the first semiconductor chip structure and a second semiconductor chip structure so that the first passivation layer faces the second passivation layer;

bonding the conductive bump to the bump pad within the stepped portion; and filling the glue layer into a gap in the stepped portion, which is not filled by the conductive bump.

8. The method of claim 7, wherein the conductive bump comprises a conductive pillar and a conductive solder formed on the conductive pillar, and the bonding of the conductive bump to the bump pad comprises thermally compressing the conductive solder to fill the conductive solder into the stepped portion.

9. A semiconductor package comprising:

a bottom semiconductor chip structure including a first bottom passivation layer including an opening region exposing a input/output pad of a bottom unit circuit part, a second bottom passivation layer including an opening region exposing a partial region of a bottom redistribution layer formed on the exposed input/output pad, a bottom bump formed in the exposed partial region of the bottom redistribution layer, and a third bottom passivation layer formed on the second bottom passivation layer and between the bottom bump and another bottom bump adjacent thereto; and a top semiconductor chip structure including a first top passivation layer including an opening region exposing a input/output pad of a top unit circuit part, a second top passivation layer including an opening region exposing a partial region of a top redistribution layer formed on the exposed input/output pad, a top bump formed in the exposed partial region of the top redistribution layer and bonded to the bottom bump, and a third top passivation layer formed on the second top passivation layer and between the top bump and another top bump adjacent thereto and adhered to the third bottom passivation layer, a glue layer applied on the third bottom passivation layer or the third top passivation layer, wherein the third bottom passivation layer and the third top passivation layer form a partition wall structure by means of bonding, and a glue material that is the same material as that of the glue layer is filled into a gap defined between the partition wall structure and the bump structure.

10. The semiconductor package of claim 9, wherein the third bottom passivation layer comprises a bottom opening region broader in width than the bottom bump, and a certain space is formed near the bottom bump by the bottom opening region, and the third top passivation layer comprises a top opening region broader in width than the top bump, and a certain space is formed near the top bump by the top opening region.

11. A method of manufacturing a semiconductor package, the method comprising:

performing a bottom semiconductor chip structure manufacturing operation including (A1) forming a first bottom passivation layer including an opening region exposing a input/output pad of a bottom unit circuit part, (A2) forming a bottom redistribution layer on the exposed input/output pad, (A3) forming a second bottom passivation layer, including an opening region exposing a partial region of the bottom redistribution layer, on the bottom redistribution layer, and (A4) forming a bottom bump formed in the exposed partial region of the bottom redistribution layer and forming a third bottom passivation layer on the second bottom passivation layer to isolate the bottom bump from another bottom bump adjacent to the bottom bump;

performing a top semiconductor chip structure manufacturing operation including (B1) forming a first top passivation layer including an opening region exposing a input/output pad of a top unit circuit part, (B2) forming a top redistribution layer on the exposed input/output pad, (B3) forming a second top passivation layer, including an opening region exposing a partial region of the top redistribution layer, on the top redistribution layer, and (B4) forming a top bump formed in the exposed partial region of the top redistribution layer and forming a third top passivation layer on the second top passivation layer to isolate the top bump from another top bump adjacent to the top bump;

performing a bottom semiconductor chip structure and a top semiconductor chip structure bonding operation including (C1) bonding the third bottom passivation layer to the third top passivation layer and (C2) bonding the bottom bump to the top bump; and filling an underfill material into an air gap defined between a partition wall structure formed by bonding the third bottom passivation layer to the third top passivation layer and a bump structure formed by bonding the bottom bump to the top bump.

12. The method of claim 11, wherein the filling of the underfill material comprises filling a tin (Sn)-based solder material into the air gap.

13. The method of claim 11, wherein the filling of the underfill material comprises filling a glue material, which is used to bond the third bottom passivation layer to the third top passivation layer in step (C1), into the air gap.

* * * * *